United States Patent
Wu et al.

(10) Patent No.: US 12,396,222 B2
(45) Date of Patent: Aug. 19, 2025

(54) RFSOI SEMICONDUCTOR STRUCTURES INCLUDING A NITROGEN-DOPED CHARGE-TRAPPING LAYER AND METHODS OF MANUFACTURING THE SAME

(71) Applicant: Taiwan Semiconductor Manufacturing Company Limited, Hsinchu (TW)

(72) Inventors: Cheng-Ta Wu, Hsinchu (TW); Chiu Hua Chen, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/632,712

(22) Filed: Apr. 11, 2024

(65) Prior Publication Data
US 2024/0274659 A1    Aug. 15, 2024

Related U.S. Application Data

(62) Division of application No. 17/838,359, filed on Jun. 13, 2022, now Pat. No. 11,984,477, which is a
(Continued)

(51) Int. Cl.
*H01L 21/28*    (2025.01)
*H01L 21/322*    (2006.01)
(Continued)

(52) U.S. Cl.
CPC ..... *H10D 62/116* (2025.01); *H01L 21/28035* (2013.01); *H01L 21/3226* (2013.01);
(Continued)

(58) Field of Classification Search
CPC ............. H10D 64/671; H10D 84/0112; H10D 84/0165; H10D 84/038; H10D 86/201;
(Continued)

(56) References Cited

U.S. PATENT DOCUMENTS 5,600,154 A    2/1997  Shimizu et al.
11,984,477 B2 *  5/2024  Wu ................... H01L 21/76254
(Continued)

FOREIGN PATENT DOCUMENTS

| CN | 107068553 A | 8/2017 |
|---|---|---|
| TW | 201917825 A | 5/2019 |
| TW | 202016369 A | 5/2020 |

OTHER PUBLICATIONS

Jianq Chyun Intellectual Property Office; CN Application No. 202011228572.7; Notice of Allowance mailed Oct. 29, 2024; 8 pages.
(Continued)

*Primary Examiner* — Galina G Yushina
(74) *Attorney, Agent, or Firm* — The Marbury Law Group, PLLC

(57) ABSTRACT

A semiconductor-on-insulator (SOI) substrate includes a handle substrate, a charge-trapping layer located over the handle substrate and including nitrogen-doped polysilicon, an insulating layer located over the charge-trapping layer, and a semiconductor material layer located over the insulating layer. The nitrogen atoms in the charge-trapping layer suppress grain growth during anneal processes used to form the SOI substrate and during subsequent high temperature processes used to form semiconductor devices on the semiconductor material layer. Reduction in grain growth reduces distortion of the SOI substrate, and facilitates overlay of lithographic patterns during fabrication of the semiconductor devices. The charge-trapping layer suppresses formation of a parasitic surface conduction layer, and reduces capaci-
(Continued)

tive coupling of the semiconductor devices with the handle substrate during high frequency operation such as operations in gigahertz range.

20 Claims, 13 Drawing Sheets

Related U.S. Application Data division of application No. 16/885,341, filed on May 28, 2020, now Pat. No. 11,362,176.

(51) Int. Cl.
| | |
|---|---|
| *H01L 21/762* | (2006.01) |
| *H10D 30/01* | (2025.01) |
| *H10D 30/67* | (2025.01) |
| *H10D 30/69* | (2025.01) |
| *H10D 62/10* | (2025.01) |
| *H10D 62/83* | (2025.01) |
| *H10D 64/66* | (2025.01) |
| *H10D 84/01* | (2025.01) |
| *H10D 84/03* | (2025.01) |
| *H10D 86/00* | (2025.01) |
| *H10D 84/90* | (2025.01) |

(52) U.S. Cl.
CPC ... *H01L 21/76202* (2013.01); *H10D 30/0413* (2025.01); *H10D 30/6739* (2025.01); *H10D 30/6758* (2025.01); *H10D 30/69* (2025.01); *H10D 62/83* (2025.01); *H10D 64/66* (2025.01); *H10D 64/661* (2025.01); *H10D 64/671* (2025.01); *H10D 84/0112* (2025.01); *H10D 84/0165* (2025.01); *H10D 84/038* (2025.01); *H10D 86/201* (2025.01); *H01J 2237/0437* (2013.01); *H01L 2924/1305* (2013.01); *H01L 2924/1517* (2013.01); *H10D 84/957* (2025.01)

(58) Field of Classification Search
CPC .......... H10D 62/116; H10D 30/0413; H10D 30/6739; H10D 30/6758; H10D 30/69; H10D 62/83; H10D 64/661; H01L 21/28035; H01L 21/3226; H01L 21/76202
See application file for complete search history.

(56) References Cited

U.S. PATENT DOCUMENTS

| | | | |
|---|---|---|---|
| 2002/0022325 | A1 | 2/2002 | Gardner et al. |
| 2002/0089038 | A1 | 7/2002 | Ning |
| 2004/0005750 | A1 | 1/2004 | Chen et al. |
| 2005/0205930 | A1 | 9/2005 | Williams, Jr. |
| 2009/0026542 | A1 | 1/2009 | Wahl |
| 2009/0194830 | A1 | 8/2009 | Ransley et al. |
| 2010/0133656 | A1* | 6/2010 | Hager, IV ........... H01L 21/3245 |
| | | | 257/E29.089 |
| 2010/0276733 | A1* | 11/2010 | Li ......................... H10F 39/107 |
| | | | 257/E29.166 |
| 2016/0351437 | A1 | 12/2016 | Peidous et al. |
| 2017/0084478 | A1* | 3/2017 | Nguyen ................ H01L 21/763 |
| 2017/0222056 | A1* | 8/2017 | Sawai ................... H10D 88/00 |
| 2018/0108670 | A1 | 4/2018 | Pavlopoulos et al. |
| 2020/0020571 | A1* | 1/2020 | Seacrist ............ H01L 21/76243 |

OTHER PUBLICATIONS

Jianq Chyun Intellectual Property Office; CN Application No. 202011228572.7; Office Action mailed Aug. 12, 2024; 18 pages.

* cited by examiner

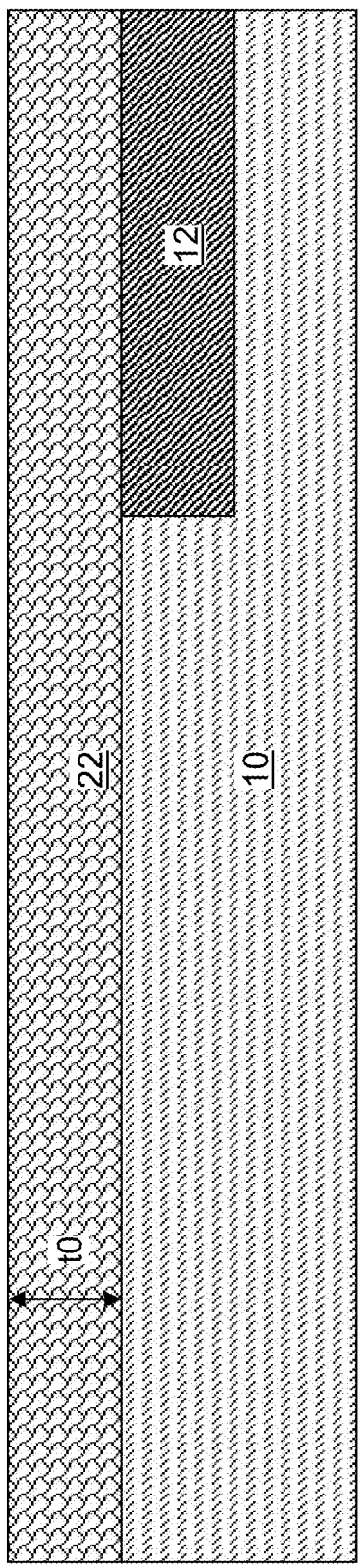
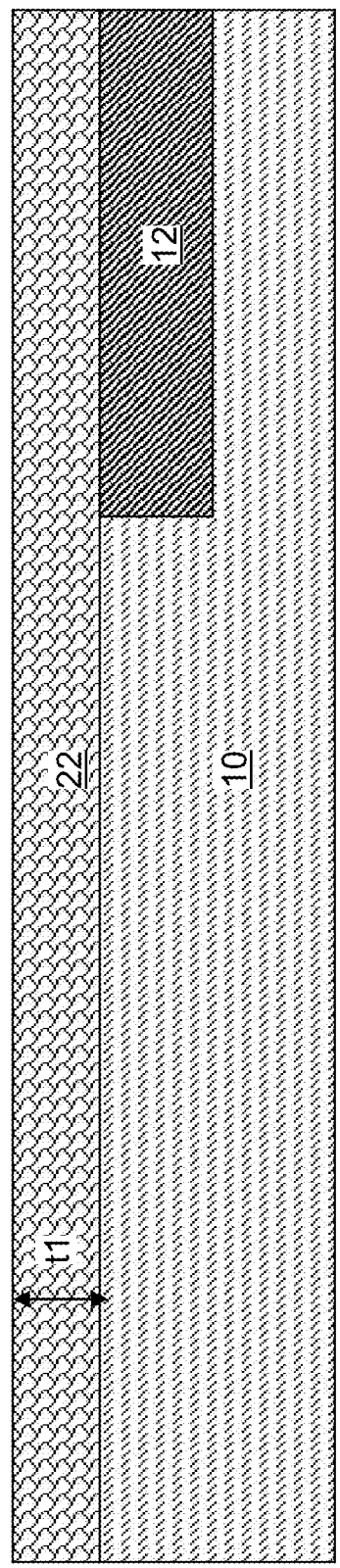
FIG. 1C
FIG. 1D

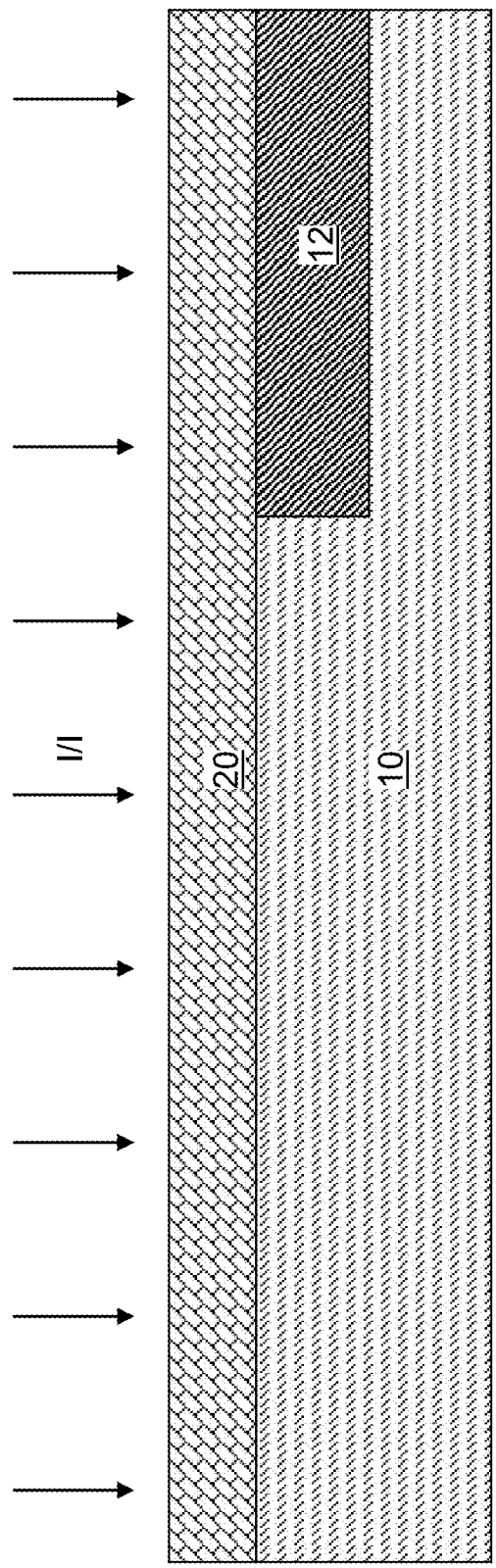
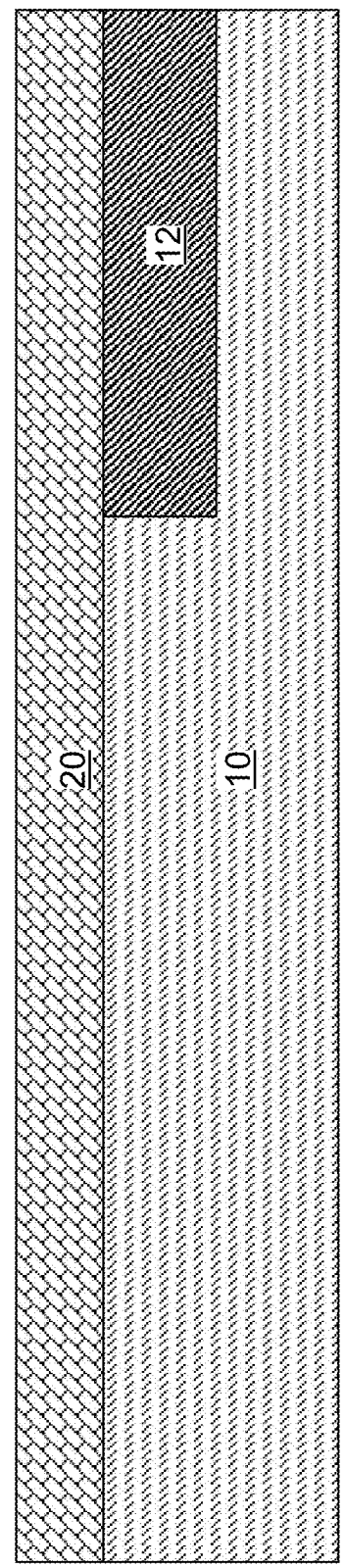

RFSOI SEMICONDUCTOR STRUCTURES INCLUDING A NITROGEN-DOPED CHARGE-TRAPPING LAYER AND METHODS OF MANUFACTURING THE SAME

RELATED APPLICATION

The instant application is a divisional application of U.S. application Ser. No. 17/838,359 entitled "RFSOI Semiconductor Structures Including A Nitrogen-Doped Charge-Trapping Layer and Methods Of Manufacturing The Same," filed on, Jun. 13, 2022, which is a divisional application of U.S. application Ser. No. 16/885,341 entitled "RFSOI Semiconductor Structures Including A Nitrogen-Doped Charge-Trapping Layer and Methods Of Manufacturing The Same," filed on May 28, 2020, the entire contents of both of which are incorporated herein by reference for all purposes.

BACKGROUND

A semiconductor-on-insulator (SOI) substrate includes a thin layer of a semiconductor material layer that is attached to a handle substrate via an intervening insulating material layer. Shallow trench isolation structures formed through the semiconductor material layer can contact the insulating layer, thereby providing electrical isolation for semiconductor devices from one another. Further, the insulating layer provides electrical isolation of the semiconductor material layer from the handle substrate. However, capacitive coupling exists between the semiconductor material layer and the handle substrate. To reduce the capacitive coupling, a high resistivity semiconductor layer can be used for the handle substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1C is a vertical cross-sectional view of the exemplary structure after deposition of a polysilicon material layer on a top surface of the handle substrate according to an embodiment of the present disclosure.

FIG. 1D is a vertical cross-sectional view of the exemplary structure after an optional thinning process that thins the polysilicon material layer according to an embodiment of the present disclosure.

FIG. 1E is a vertical cross-sectional view of the exemplary structure after an ion implantation process that implants nitrogen ions into the polysilicon material layer to form a charge-trapping layer according to an embodiment of the present disclosure.

FIG. 1F is a vertical cross-sectional view of the exemplary structure after an anneal process that anneals the charge-trapping layer according to an embodiment of the present disclosure.

DETAILED DESCRIPTION

Figure 1A:
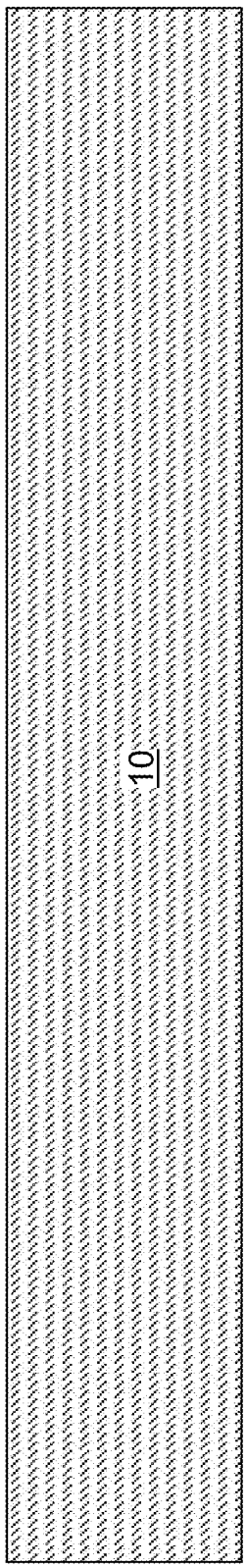
FIG. 1A is a vertical cross-sectional view of an exemplary structure that includes a handle substrate for forming a radio frequency semiconductor-on-insulator (RFSOI) semiconductor structure according to an embodiment of the present disclosure.

The present disclosure is directed generally to semiconductor devices, and specifically to radio frequency semiconductor-on-insulator (RFSOI) semiconductor structures including a nitrogen-doped charge-trapping layer and methods of manufacturing the same.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1A, a handle substrate 10 for formation of a semiconductor-on-insulator (SOI) substrate of the present disclosure is illustrated. The handle substrate 10 may have a high electrical resistivity. The high electrical resistivity may be utilized to reduce capacitive coupling between the handle substrate 10 and a semiconductor material layer that may be subsequently formed thereupon. The range of the direct-current resistivity of the semiconductor material (such as single crystalline silicon) in the handle substrate 10 may be in the range from $3.0 \times 10^2$ Ω-cm to $3.0 \times 10^4$ Ω-cm, such as a range from $1.0 \times 10^3$ Ω-cm to $1.0 \times 10^4$ Ω-cm, although lower and higher direct-current resistivity may also be used. A direct-current resistivity refers to the resistivity of the material in the under a direct current (DC) electrical bias condition. Such high DC resistivity for the handle substrate 10 may be provided by using a single crystalline semiconductor material having a very low level of electrical doping. For example, the handle substrate 10 may include single crystalline silicon having an atomic concentration of electrical dopants (which may be p-type dopants or n-type dopants) in a range from $3.0 \times 10^{11}/cm^3$ to $3.0 \times 10^{13}/cm^3$, such as a range from $1.0 \times 10^{12}/cm^3$ to $1.0 \times 10^{13}/cm^3$, although lower and higher atomic concentration of electrical dopants may also be used. The electrical dopants may be p-type electrical dopants such as boron or n-type electrical dopants such as phosphorus, arsenic, and/or antimony. Other dopants consistent with the contemplated scope of disclosure may be used.

The thickness of the handle substrate 10 may be selected to provide sufficient mechanical support to layers and structures that may be subsequently formed thereupon. In one embodiment, the thickness of the handle substrate 10 may be in a range from 100 microns to 2 mm, although lesser and greater thickness of handle substrate may be used. In one embodiment, the entirety of the handle substrate 10 may be single crystalline. In one embodiment, the handle substrate 10 may include, and/or may consist of, single crystalline silicon. The conductivity type of the handle substrate 10 is herein referred to as a first conductivity type, which may be p-type or n-type. In one embodiment, the handle substrate 10 may include, and/or may consist of, a commercially available silicon substrate having a diameter such as 200 mm, 300 mm, or 450 mm, and having DC resistivity in a range from $3.0 \times 10^2$ Ω-cm to $3.0 \times 10^4$ Ω-cm, although lower and higher direct-current resistivity may also be used.

Use of a high DC resistivity material in the formation of the handle substrate 10 may be ideal when the SOI substrate is to be subsequently used in applications that desire a high level of device isolation (such as radio frequency devices) or a high Q factor passive components (such as a resonance circuit). The high DC resistivity of the handle substrate 10 also enables fabrication of various hybrid devices including complementary metal-oxide-semiconductor (CMOS) devices, bipolar devices, and/or passive devices (such as resistors, diodes, thyristors, capacitors, varactors, inductors, antennas, etc.).

The high DC resistivity of the handle substrate 10 may be provided by a low level of electrical dopants in the handle substrate 10. The high DC resistivity of the handle substrate 10 may provide suitable electrical decoupling from semiconductor devices that may be subsequently formed in a semiconductor material layer. At high frequencies, however, a different mechanism may have an impact to increase the capacitive coupling between the handle substrate 10 and the semiconductor devices that may be subsequently formed in, or above, an overlying semiconductor material layer. Specifically, a parasitic surface conduction layer may be formed at a surface portion of the handle substrate 10 in proximity to the interface with an insulating layer that may be subsequently formed. In other words, a surface layer of free charge carriers may be formed underneath the interface between the handle substrate 10 including a single crystalline semiconductor material and an insulating layer upon formation of the insulating layer in a subsequent processing step. The insulating layer typically includes silicon oxide, and formation of the fixed oxide charges in the insulating layer may induce the formation of the parasitic surface conduction layer at high frequencies such as 1 GHz or higher. The parasitic surface conduction layer may dominate the conductivity of the handle substrate 10 at high frequencies (such as 1 GHz or higher), and limits the effective resistivity of the handle substrate 10 below 200 Ω-cm irrespective of the DC resistivity of the handle substrate 10. Higher effective resistivity of the handle substrate is desired for high performance of radio frequency semiconductor-on-insulator (RFSOI) devices.

The parasitic surface conduction layer may act as an accumulation or an inversion layer depending on the type of charges present in an overlying insulating layer. High frequency voltage signals that may be generated in the semiconductor devices that may be subsequently formed in a semiconductor material layer (that overlies the insulating layer) interact with the parasitic surface conduction layer to generate eddy currents. This interaction may result in device cross-talk and/or non-linear distortions resulting in RF signal losses. Such cross-talk and signal losses may be significant at frequency ranges above 1 GHz, such as from 1 GHz to 100 GHz.

According to embodiments of the present disclosure, a charge-trapping layer that may be subsequently formed provides charge trapping for the free electrical charges generated in the handle substrate 10. By rendering the free electrical charges in the handle substrate immobile, the charge-trapping layer of the present disclosure may reduce the capacitive coupling between semiconductor devices subsequently formed in a semiconductor material layer and the handle substrate 10. Thus, the signal fidelity of the subsequently formed semiconductor devices may be increased. According to another embodiment of the present disclosure, the charge-trapping layer may be implanted with nitrogen atoms. By implanting the charge-trapping layer with nitrogen ions, the grain growth in the charge-trapping layer may be suppressed during subsequent anneal processes. Suppression of grain growth during subsequent anneal processes reduces structural distortion such as warping (warpage) of the SOI substrate, and allows lithographic patterning of various device features in subsequent processing steps within reduced overlay deviations with respect to previously patterned structures.

Figure 1B:
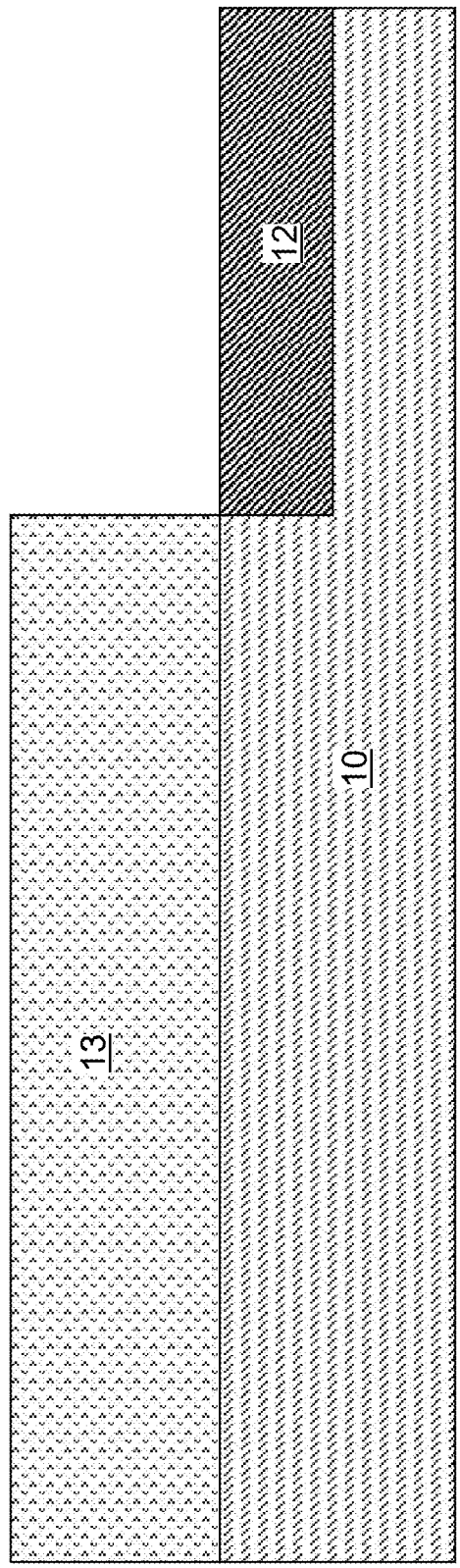
FIG. 1B is a vertical cross-sectional view of the exemplary structure after formation of a collector region for an optional bipolar transistor according to an embodiment of the present disclosure.

Referring to FIG. 1B, a processing step may be optionally performed in embodiments in which the formation of bipolar transistors may be desired. For example, a patterned implantation mask layer 13 (such as a lithographically patterned photoresist layer) may be formed over the top surface of the handle substrate 10. The patterned implantation mask layer 13 includes an opening in areas in which a collector region 12 may be subsequently formed. In embodiments in which the handle substrate 10 includes dopants of the first conductivity type, dopants of a second conductivity type may be implanted into a surface region of the handle substrate 10 that underlies the opening in the patterned implantation mask layer 13. The second conductivity type is the opposite of the first conductivity type. For example, the first conductivity type can be p-type and the second conductivity type can be n-type, or vice versa. A collector region 12 may be formed underneath the opening in the patterned implantation mask layer 13. While the present disclosure is described using an embodiment in which only a single collector region 12 is illustrated, it is understood that the patterned implantation mask layer 13 may be a photoresist layer that is patterned in a lithographic stepped with multiple lithographic exposure fields, that each lithographic exposure field includes a pattern for at least one semiconductor die (which may be a single semiconductor die or a plurality of semiconductor dies), and that each pattern for a semiconductor die may include a pattern for a single collector region 12 or a plurality of collector regions 12. As such, multiple repetition of each illustrative pattern in the drawings of the instant application over a same handle substrate 10 is expressly contemplated.

The depth of the p-n junction formed between the collector region 12 and the semiconductor material of the first conductivity type in the handle substrate 10 can be in a range from 300 nm to 2,000 nm, such as from 600 nm to 1,200 nm, although lesser or greater depths may also be used. The average dopant concentration of the dopants of the second conductivity type in the collector region 12 may be in a range from $3\times10^{15}/cm^3$ to $3\times10^{18}/cm^3$, although lesser and greater average dopant concentrations may also be used. The vertical profile of the atomic concentration of the dopants of the second conductivity type may be optimized for enhanced performance of a bipolar transistor to be subsequently formed. The patterned implantation mask layer 13 may be subsequently removed, for example, by ashing. The area of the ion implantation may be limited only to areas in which the collector region(s) 12 is/are formed in order to minimize formation of high conductivity material regions in the handle substrate 10.

Referring to FIG. 1C, a polysilicon material layer 22 may be formed on the top surface of the handle substrate 10. The polysilicon material layer 22 may be formed by a conformal or non-conformal deposition process. In one embodiment, the polysilicon material layer 22 may be formed by a chemical vapor deposition process using a silicon-containing precursor gas such as silane, disilane, and/or dichlorosilane. For example, the polysilicon material layer 22 may be formed by a low pressure chemical vapor deposition (LPCVD) process, a rapid thermal chemical vapor deposition (RTCVD) process, or a plasma-enhanced chemical vapor deposition (PECVD) process. Depending on the silicon-containing precursor gas used in the deposition process and depending on the partial pressure of the silicon-containing precursor gas, the deposition temperature of the chemical vapor deposition process may be in a range from 550 degrees Celsius to 700 degrees Celsius. In an illustrative example, in case silane is used as the silicon-containing precursor gas, the deposition temperature may be in a range from 600 degrees Celsius to 670 degrees Celsius, although lesser and greater deposition temperatures can also be used. Generally, the polysilicon material layer 22 may be deposited at a temperature that deposits silicon in a polycrystalline phase. In other words, deposition of silicon in an amorphous phase may be avoided because amorphous phase silicon can be transformed into polysilicon with a large average grain size than a polysilicon material deposited as a polysilicon material and is subsequently annealed that collaterally increases the average grain size. The initial thickness t0 of the polysilicon material layer 22 can be in a range from 550 nm to 4,000 nm, such as from 750 nm to 3,500 nm, although lesser and greater thicknesses can also be used.

In one embodiment, the polysilicon material layer 22 may be substantially free of electrical dopants (such as p-type dopants and n-type dopants), or may have a low level of electrical dopants. In one embodiment, the polysilicon material layer 22 may be deposited as an undoped polysilicon material layer, i.e., a polysilicon material layer without any intentional doping. Thus, any electrical dopant in the polysilicon material layer 22 is introduced unintentionally as impurities during the deposition process. If a collector region 12 is present, some autodoping may occur in portions of the polysilicon material layer 22 that are proximal to the collector region 12. In one embodiment, the average atomic concentration of electrical dopants in the polysilicon material layer 22 can be less than $3.0\times10^{13}/cm^3$. For example, the average atomic concentration of electrical dopants in the polysilicon material layer 22 can be in a range from $1.0\times10^{10}/cm^3$ to $3.0\times10^{13}/cm^3$, such as a range from $1.0\times10^{11}/cm^3$ to $1.0\times10^{13}/cm^3$, although lesser or greater average atomic concentration of electrical dopants may also be used.

The polysilicon material layer 22 may include crystallographic grains with mixed crystallographic orientations. The grain boundaries generally extend along the growth direction, i.e., the vertical direction. The average grain size of the polysilicon material layer 22 can be determined by taking a horizontal cross-sectional view of the polysilicon material layer, counting the number of grains within a region having a statistically meaningful number of grains (such as 1,000 or more), calculating the average grain area by dividing the area of the region by the total number of the grains, and by calculating the diameter of a circle having the same area as the average grain area. In one embodiment, the average grain size of the polysilicon material layer 22 may be in a range from 20 nm to 100 nm, although lesser and greater average grain sizes can also be used. In one embodiment, the average grain size of the polysilicon material layer 22 may gradually increase with a vertical distance from the handle substrate 10, for example, by about 20% over the thickness of the polysilicon material layer 22.

The grain boundaries in the polysilicon material layer 22 provide localized states for charge carriers of the semiconductor material of the polysilicon material layer 22. Thus, free charge carriers that diffuse from the handle substrate 10 toward the polysilicon material layer 22 occupy localized electronic states at the grain boundaries, and become trapped within the polysilicon material layer 22. Thus, the polysilicon material layer 22 functions as a charge-trapping layer for the free charge carries in the handle substrate 10, and thus, has the effect of depleting free charge carriers from the handle substrate 10.

Referring to FIG. 1D, the polysilicon material layer 22 may be optionally thinned, for example, by a chemical mechanical planarization (CMP) process. A touch-up polishing process may be used to provide a smooth top surface for the polysilicon material layer 22. The thickness of the polysilicon material layer 22 after the planarization process is herein referred to as a first thickness t1 is less than initial thickness t0. The first thickness t1 may be in a range from 550 nm to 3,250 nm, such as from 750 nm to 3,000 nm, although lesser and greater thicknesses can also be used.

Referring to FIG. 1E, nitrogen ions may be implanted into the polysilicon material layer 22. The polysilicon material layer 22 with implanted nitrogen ions therein is hereafter referred to as a charge-trapping layer 20. The total dose of the nitrogen ions during the nitrogen ion implantation process may be selected such that the average atomic concentration of nitrogen atoms in the charge-trapping layer 20 is in a range from $1.0 \times 10^{16}/cm^3$ to $1.0 \times 10^{20}/cm^3$, such as from $1.0 \times 10^{17}/cm^3$ to $5.0 \times 10^{19}/cm^3$, although lesser or greater average atomic concentration of nitrogen atoms may also be used. The dose of the implanted nitrogen ions may be selected such that a sufficient number of nitrogen ions are present in the charge-trapping layer 20 to impede grain growth in the nitrogen-doped polysilicon material of the charge-trapping layer 20 in subsequent high temperature processes (such as anneal processes). In embodiments in which the charge-trapping layer 20 has a thickness in a range from 500 nm to 3,800 nm, the total dose of the nitrogen ions during the nitrogen ion implantation process can be in a range from $5.0 \times 10^{11}/cm^3$ to $3.8 \times 10^{16}/cm^3$. The total dose of the nitrogen atoms can be in a range that can subsequently prevent significant changes in the grain size of the polycrystalline material in the charge-trapping layer 20 during a subsequent anneal process. The energy of the implanted nitrogen ions may be in a range from 0.5 MeV to 50 MeV, although lesser and greater implantation energies may also be used. The nitrogen ion implantation process may include a plurality of implantation steps with different target depths, and correspondingly different implantation energies in order to provide relatively uniform doping of nitrogen atoms throughout the charge-trapping layer 20. In one embodiment, the target depths and the dose of each of the multiple implantation steps in the nitrogen ion implantation process may be selected such that the overall variation of the atomic concentration of nitrogen ions within the charge-trapping layer 20 as a function of a vertical distance from the handle substrate 10 is within 50%, such as within 30% and/or within 20%, of the average atomic concentration of the nitrogen atoms in the charge-trapping layer 20. In one embodiment, the atomic concentration of nitrogen atoms in the charge-trapping layer is within a range from 70% of the average atomic concentration of the nitrogen atoms to 130% of the average atomic concentration of the nitrogen atoms.

In one embodiment, the charge-trapping layer 20 may consist essentially of silicon atoms and nitrogen atoms. In this case, the charge-trapping layer 20 does not include electrical dopants, or includes electrical dopants at a trace level, such as less than 1 parts per million in atomic concentration. Thus, the charge trapping layer consists essentially of silicon atoms and nitrogen atoms but may include trace levels of electrical dopants. In one embodiment, the atomic concentration of all other elements in the charge-trapping layer 20 except silicon atoms and nitrogen atoms can be less than $3.0 \times 10^{13}/cm^3$. Virtual absence of electrical dopants within the charge-trapping layer 20 has the beneficial effect of removing the source of free charge carriers, and thus, has the effect of increasing the resistivity of the charge-trapping layer 20. Thus, the capacitive coupling between the charge-trapping layer 20 and semiconductor devices to be subsequently formed in, or on, a semiconductor material layer to be subsequently formed over the charge-trapping layer 20 may be reduced.

Optionally, additional non-electrical dopants other than nitrogen atoms may be implanted in addition to the nitrogen ions. Such non-electrical dopants may assist the implanted nitrogen atoms in suppressing grain growth in the charge-trapping layer in subsequent high temperature processing steps. Such optional non-electrical dopants may include carbon atoms, argon atoms, chlorine atoms and/or bromine atoms. A single species of an additional non-electrical dopant or multiple species of additional non-electrical dopants may be used. The total atomic concentration of the additional non-electrical dopants may be in a range from $1.0 \times 10^{16}/cm^3$ to $1.0 \times 10^{20}/cm^3$, such as from $1.0 \times 10^{17}/cm^3$ to $5.0 \times 10^{19}/cm^3$, although lesser or greater atomic concentrations may also be used. In one embodiment, the average atomic concentration of nitrogen atoms in the charge-trapping layer 20 can be greater than, or less than, the average atomic concentration of the additional non-electrical dopants in the charge-trapping layer 20.

Referring to FIG. 1F, an anneal process may be performed at an elevated temperature to stabilize the polycrystalline grain structure in the charge-trapping layer 20 against subsequent high temperature anneal processes. The elevated temperature may be in a range from 600 degrees Celsius to 1,050 degrees Celsius, such as from 800 degrees Celsius to 1,025 degrees Celsius. In one embodiment, the elevated temperature may be in a range from 900 degrees Celsius to 1,000 degrees Celsius. The duration of the anneal process at the elevated temperature may be in a range from 30 minutes to 60 hours, although lesser and greater anneal duration may also be used. In one embodiment, the anneal temperature may be selected to be about the same as the highest anneal temperature to be employed in subsequent processing steps. In such an embodiment, the subsequent anneal processes are performed at operational parameters that do not introduce any further change in the grain structure of the charge-trapping layer 20. Generally, a higher anneal temperature are maintained for a shorter duration of the anneal process, and lower anneal temperature are maintained for a longer duration of the anneal process. Subjecting the charge-trapping layer 20 to the anneal process at this processing step serves the purpose of inducing possible structural changes that would otherwise occur in a subsequent high temperature processing step at this processing step. In other words, the anneal process may accelerate the structural changes in the charge-trapping layer 20 and accompanying warpage of the handle substrate at this processing step instead of having such changes occur at a later processing step.

Figure 2:
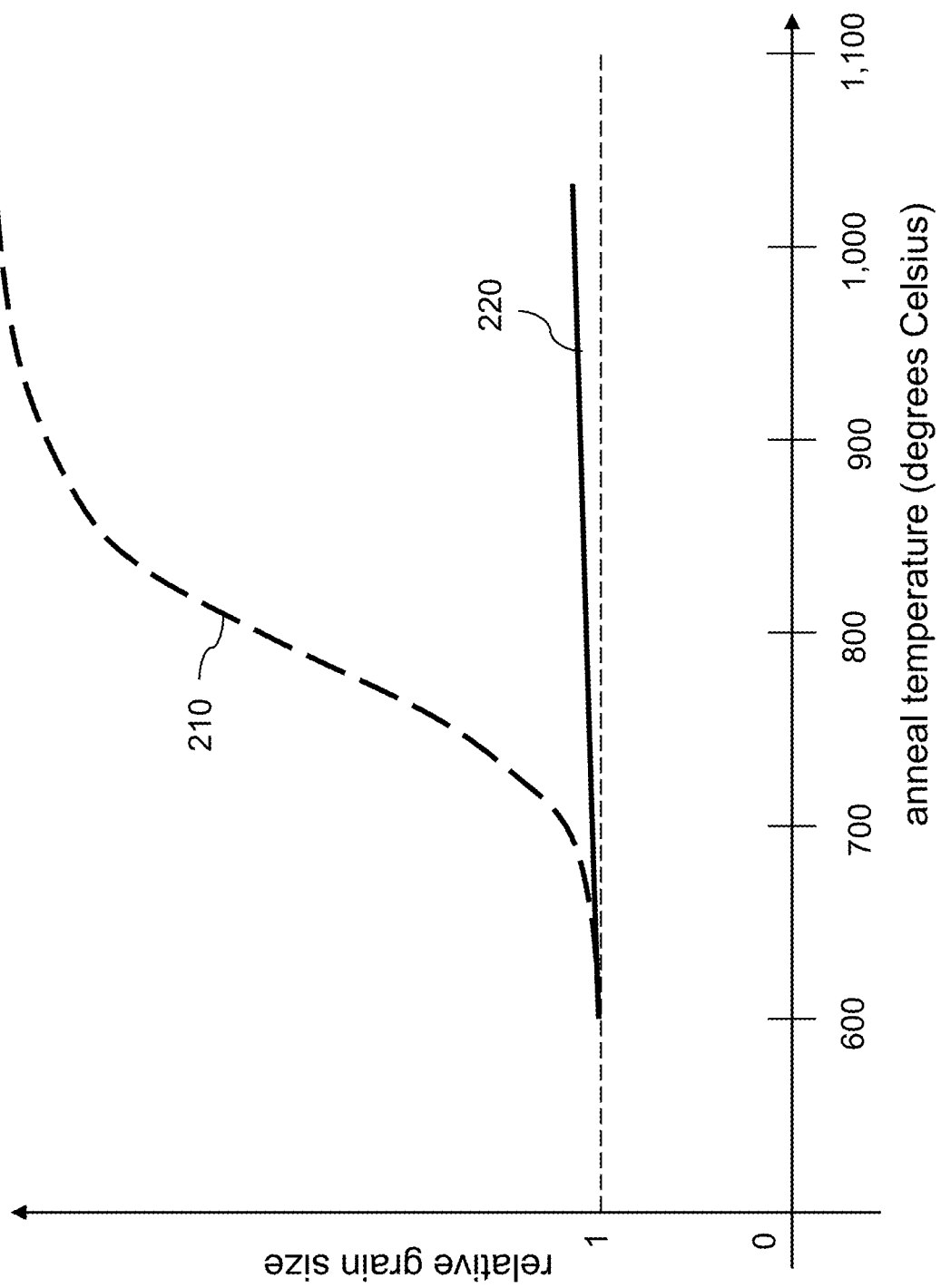
FIG. 2 is a graph that schematically illustrates the effect of implanted nitrogen atoms in the charge-trapping layer in suppressing growth of grain size during a subsequent anneal process according to an embodiment of the present disclosure.

According to an aspect of the present disclosure, the presence of the nitrogen atoms in the charge-trapping layer 20 may have the effect of suppressing grain growth during the anneal process. Referring to FIG. 2, curve 210 schematically illustrates the ratio of the post-anneal average grain size to the as-deposited average grain size for an undoped polysilicon material. Curve 220 schematically illustrates the ratio of the post-anneal average grain size to the as-deposited average grain size for a nitrogen-doped polysilicon material that may be used for the charge-trapping layer 20 of the various embodiments. The duration of the anneal at the anneal temperature is about 40 minutes for each anneal process. The undoped polysilicon material of curve 210 consists essentially of silicon atoms in a polycrystalline form. The grain size can grow by a factor of almost 4 as the anneal temperature increases. The nitrogen-doped polysilicon material of curve 220 shows that the grain size growth can be less than 20% even after an anneal of about 900 degrees Celsius. While the graph of FIG. 2 is intended to illustrate only the general trend in the changes in the average grain size, it is clear that implanted nitrogen is effective in suppressing grain growth in the charge-trapping layer 20.

Figure 3:
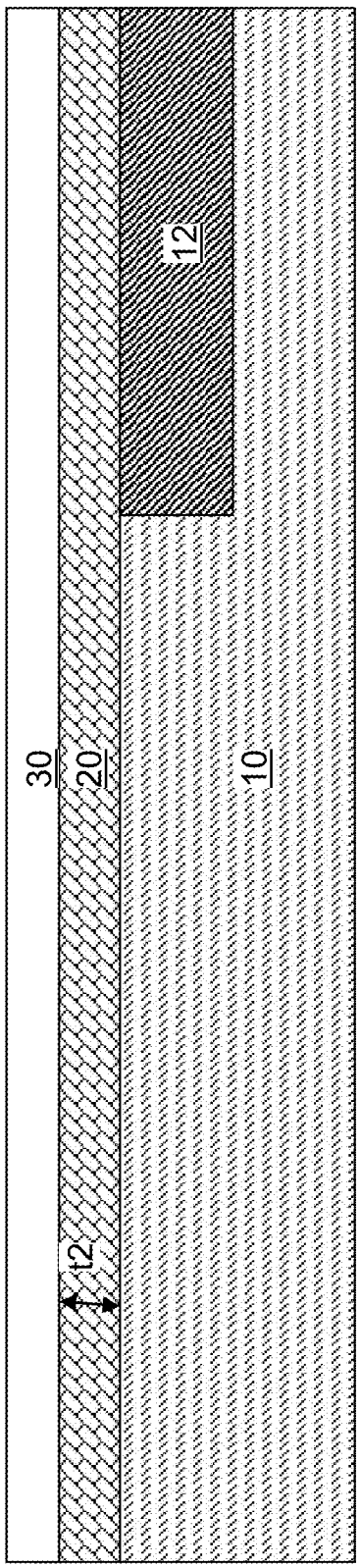
FIG. 3 is a vertical cross-sectional view of the exemplary structure after formation of an insulating layer by thermal oxidation of an upper portion of the charge-trapping layer according to an embodiment of the present disclosure.

Referring to FIG. 3, a thermal oxidation process may be performed to oxidize a surface portion of the charge-trapping layer 20 into an insulating layer 30 including thermal silicon oxide. Thermal silicon oxide is stoichiometric silicon oxide that is essentially free of hydrogen atoms. In embodiments in which the additional implanted ions in the charge-trapping layer 20 do not include carbon atoms, the thermal silicon oxide of the insulating layer 30 can be essentially free of carbon atoms. A wet oxidation process or a dry oxidation process can be performed to convert the surface portion of the charge-trapping layer 20 into the insulating layer 30. The temperature of the oxidation process may be in a range from 800 degrees Celsius to 1,100 degrees Celsius. The temperature of the oxidation process may be selected to be about the same as the highest processing temperature in subsequent processing steps to prevent subsequent grain size changes in the charge-trapping layer 20 in the subsequent processing steps.

The thickness of the insulating layer 30 may be in a range from 50 nm to 600 nm, such as from 100 nm to 500 nm, although lesser and greater thicknesses can also be used. The thickness of the charge-trapping layer 20 as thinned by the oxidation process is herein referred to as a second thickness t2. The second thickness t2 may be in a range from 500 nm to 3,000 nm, although lesser and greater thicknesses can also be used. The thermal oxidation process has a collateral effect of providing a further anneal to the nitrogen-doped polysilicon material in the charge-trapping layer 20, and thus, stabilizes the microcrystalline structure of the nitrogen-doped polysilicon material in the charge-trapping layer 20. Generally speaking, the charge-trapping layer 20 may be annealed at an elevated temperature in a range from 900 degrees Celsius to 1,100 degrees Celsius for a duration in a range from 10 seconds to 120 minutes prior to formation of a semiconductor device (such as a field effect transistor) on a semiconductor material layer in a dedicated anneal process or in a thermal oxidation process that collaterally provides an anneal process.

Figure 4B:
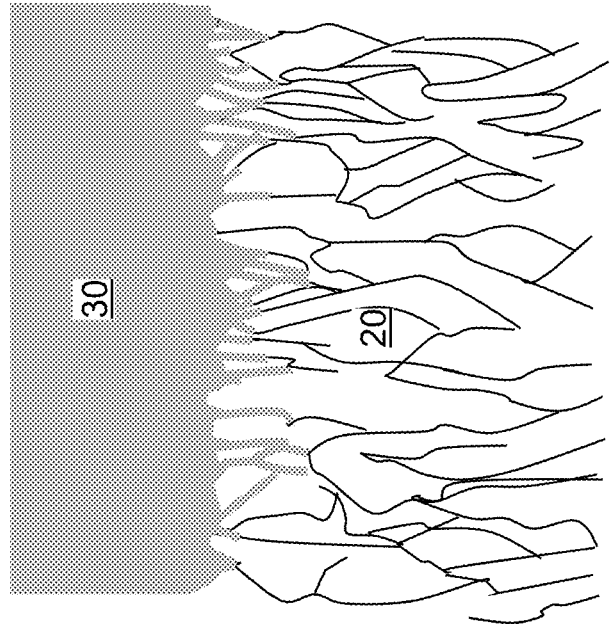
FIG. 4B is a schematic diagram of a polycrystalline grain structure at an interface with the insulating layer after the processing steps of FIG. 3.
Figure 4A:
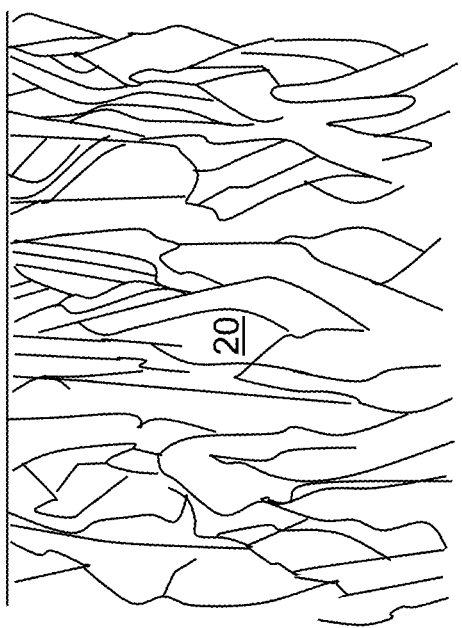
FIG. 4A is a schematic diagram of a polycrystalline grain structure near a top surface of the charge-trapping layer after the processing step of FIG. 1F.

FIGS. 4A and 4B illustrate microstructural changes at a topmost portion of the charge-trapping layer 20 during the thermal oxidation process that forms the insulating layer 30. FIG. 4A illustrates a polycrystalline grain structure near a top surface of the charge-trapping layer after the processing step of FIG. 1F. FIG. 4B illustrates a polycrystalline grain structure at an interface with the insulating layer after the processing steps of FIG. 3.

Generally, oxygen atoms diffuse along grain boundaries of the charge-trapping layer 20 during the thermal oxidation process of FIG. 3. Thus, in additional to a generally horizontal interface between the charge-trapping layer 20 and the insulating layer 30 that can be used to define the thicknesses of the charge-trapping layer 20 and the insulating layer 30, the interface between the insulating layer 30 and the charge-trapping layer 20 includes downward-protruding thermal silicon oxide portions that extend along grain boundaries toward the handle substrate 10. Thermal anneal generally reduces the grain boundaries in a polysilicon material through silicon-to-silicon self-interstitial diffusion, and generates tensile stress to surrounding material portions. Thermal silicon oxide formed by thermal oxidation of silicon results in expansion of volume of the converted portion through incorporation of oxygen atoms, and thus, applies compressive element to surrounding material portions. Thus, an interface between thermal silicon oxide and a nitrogen-free polysilicon material that is prone to grain growth would provide an unstable interface that is prone to further oxidation and further grain growth due to the complementary stress in the thermal silicon oxide and the undoped polysilicon material.

According to an embodiment of the present disclosure, the nitrogen atoms in the charge-trapping layer may suppress the growth of grains in the charge-trapping layer 20. The nitrogen implanted charge-trapping layer 20 may thus, prevent interplay of the complementary stresses between the thermal silicon oxide material and the nitrogen-doped polysilicon material. As a result, the interface between the thermal silicon oxide and the nitrogen-doped polysilicon material of the charge-trapping layer 20 may be stabilized. Without wishing to be bound any particular theory, it is believed that the implanted nitrogen atoms accumulate at the grain boundaries in the nitrogen-doped polysilicon material of the charge-trapping layer 20 and retards the intergranular oxidation of the nitrogen-doped polysilicon material. Thus, the vertical extent of the downward-protruding thermal silicon oxide portions that extend along grain boundaries toward the handle substrate 10 may be less within the charge-trapping layer 20 of the present disclosure than within an undoped polysilicon material layer having a same thickness and subjected to a same thermal oxidation process.

Figure 5A:
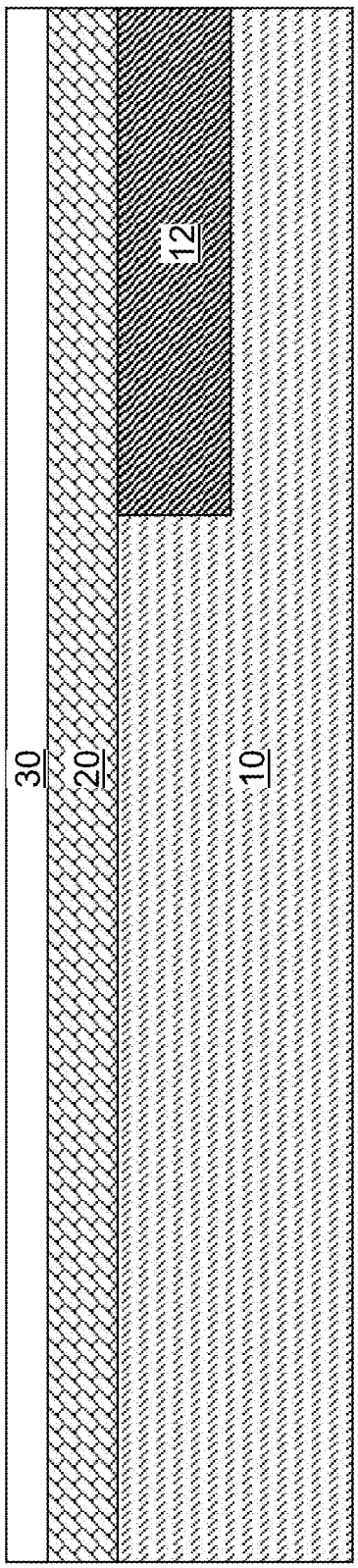
FIG. 5A is a vertical cross-sectional view of the exemplary structure after an optional step that thins the insulating layer according to an embodiment of the present disclosure.

Referring to FIG. 5A, the insulating layer 30 including, and/or consisting essentially of, thermal silicon oxide can be optionally thinned, for example, by polishing and/or by etching (such as wet etching or dry etching). The thickness of the insulating layer 30 after this processing step may be in a range from 50 nm to 500 nm, such as from 100 nm to 400 nm, although lesser and greater thicknesses can also be used.

Figure 5B:
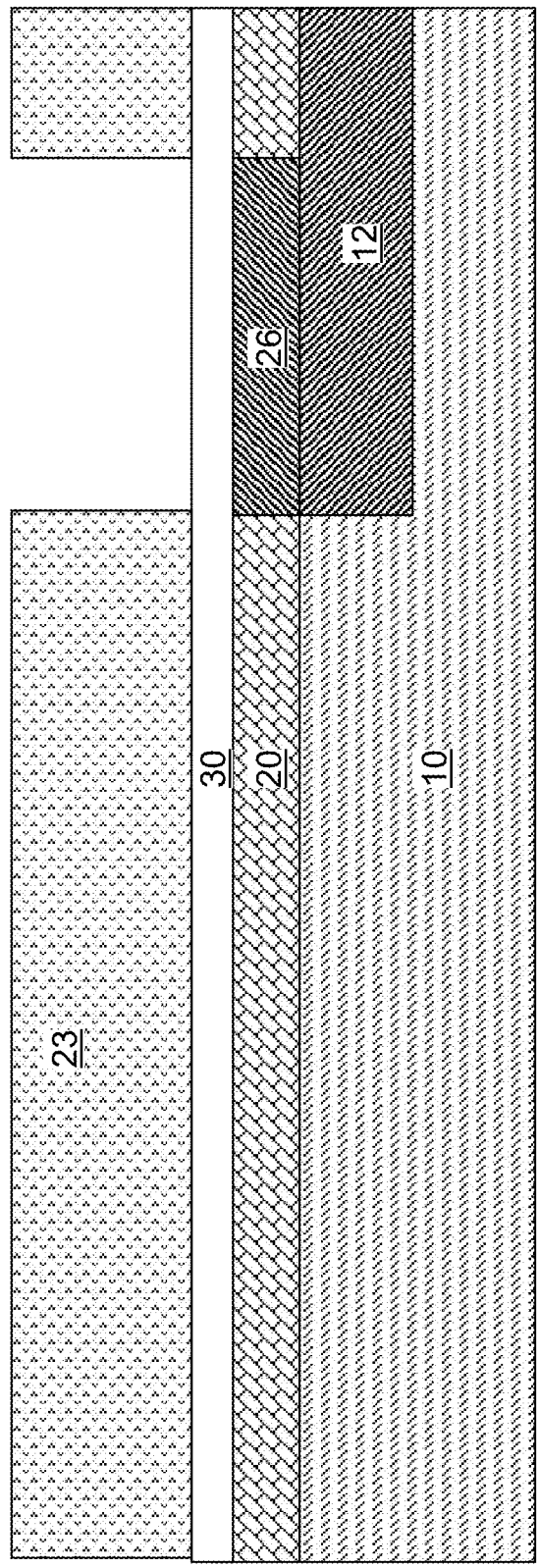
FIG. 5B is a vertical cross-sectional view of the exemplary structure after formation of an extrinsic base region for the optional bipolar transistor according to an embodiment of the present disclosure.

Referring to FIG. 5B, a patterned implantation mask layer 23 (such as a lithographically patterned photoresist layer) may be optionally formed over the insulating layer 30. The patterned implantation mask layer 23 includes an opening in an area located within the periphery of the collector region 12. Dopants of the first conductivity type can be implanted through the opening in the patterned implantation mask layer 23 into an underlying portion of the charge-trapping layer 20 to form a doped semiconductor region having a doping of the first conductivity type, which functions as an extrinsic base region 26 for the optional bipolar transistor. The extrinsic base region 26 may, or may not, contact the top surface of the collector region 12. The atomic concentration of dopants of the first conductivity type in the extrinsic base region 26 may be in a range from $5.0\times10^{19}/cm^3$ to $1.0\times10^{20}/cm^3$, although lesser and greater dopant concentrations can also be used. The patterned implantation mask layer 23 may be subsequently removed, for example, by ashing.

Figure 5C:
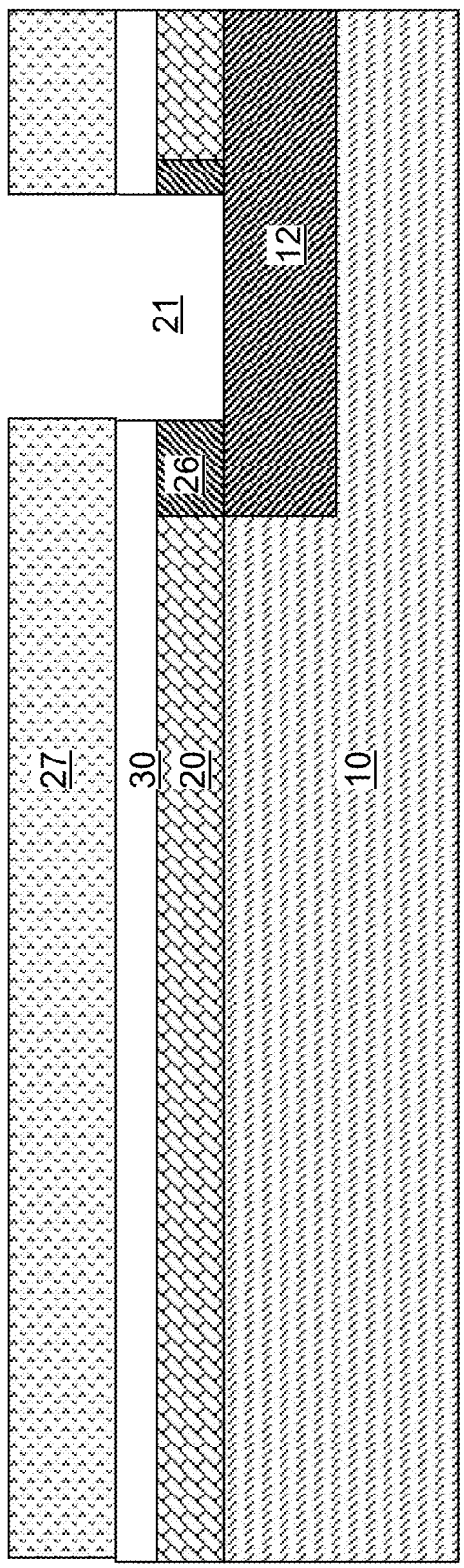
FIG. 5C is a vertical cross-sectional view of the exemplary structure after formation of a base cavity for the optional bipolar transistor according to an embodiment of the present disclosure.

Referring to FIG. 5C, a patterned etch mask layer 27 (such as a lithographically patterned photoresist layer) may be optionally formed over the insulating layer 30. The patterned etch mask layer 27 may include an opening in an area located within the periphery of the extrinsic base region 26. An anisotropic etch process may be performed to etch through unmasked portions of the insulating layer 30 and the extrinsic base region 26 and to physically expose a top surface of the collector region 12. A base cavity 21 extending from the top surface of the insulating layer 30 to a top surface of the collector region 12 may be formed through the insulating layer 30 and the charge-trapping layer 20. In one embodiment, the base cavity 21 may have vertical or tapered sidewalls. The patterned etch mask layer 27 can be subsequently removed, for example, by ashing.

Figure 5D:
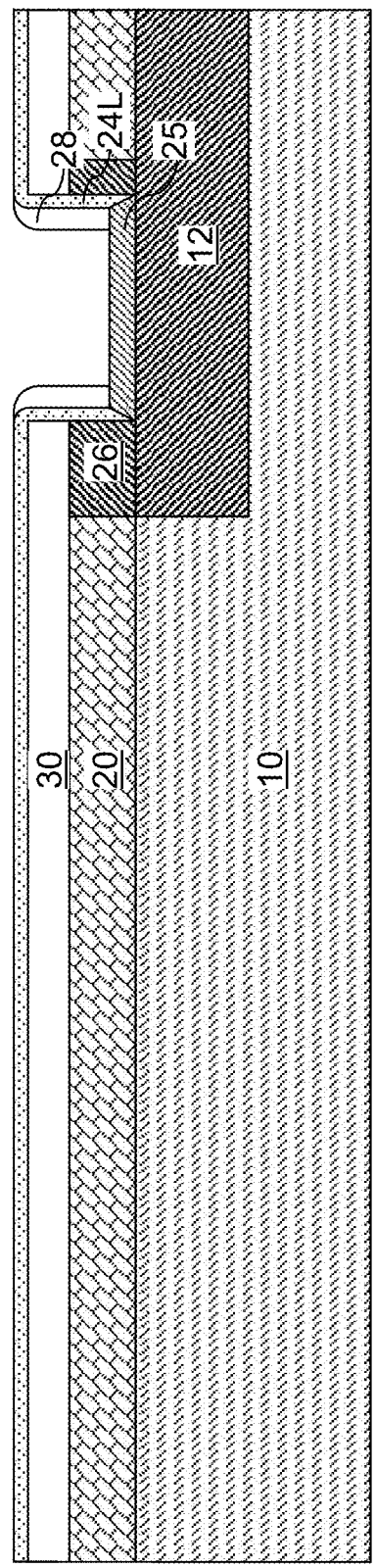
FIG. 5D is a vertical cross-sectional view of the exemplary structure after formation of an epitaxial base region and a polycrystalline base material region for the optional bipolar transistor according to an embodiment of the present disclosure.

Referring to FIG. 5D, a semiconductor epitaxy process may be performed to grow a doped semiconductor material having a doping of the first conductivity type from the physically exposed semiconductor surfaces of the collector region 12 and the charge-trapping layer 20. A semiconductor epitaxy process is a growth process that deposits a single crystalline semiconductor material on physically exposed semiconductor surfaces. The semiconductor epitaxy process deposits a polycrystalline semiconductor material on physically exposed polycrystalline semiconductor surfaces. The semiconductor epitaxy process may be a selective semiconductor epitaxy process or a non-selective semiconductor epitaxy process. A selective semiconductor epitaxy process is a semiconductor deposition process that grows a single crystalline semiconductor material from physically exposed single crystalline semiconductor surfaces while suppressing growth of a semiconductor material from physically exposed dielectric surfaces. In such an embodiment, an etchant such as gaseous hydrogen chloride may be flowed into a process chamber concurrently or alternately with the flow of a reactant (such silane or disilane) into the process chamber at a rate that etches nucleated semiconductor materials from insulating surfaces (such as the surfaces of the insulating layer 30). A non-selective semiconductor epitaxy process is a semiconductor deposition process that deposits single crystalline semiconductor material from physically exposed single crystalline semiconductor surfaces while depositing a polycrystalline semiconductor material on polycrystalline semiconductor surfaces and dielectric surfaces.

The semiconductor epitaxy process may form an epitaxial base region 25 that is epitaxially aligned to the collector region 12 on a physically exposed top surface of the collector region 12, and forms a polycrystalline base material layer 24L on the physically exposed surfaces of the charge-trapping layer 20. If the semiconductor epitaxy process is a non-selective semiconductor epitaxy process, the polycrystalline base material layer 24L grows from physically exposed sidewalls of the charge-trapping layer 20 and from the physically exposed surfaces of the insulating layer. If the semiconductor epitaxy process is a selective semiconductor epitaxy process, a polycrystalline material can grow only from the physically exposed surfaces of the charge-trapping layer 20 while suppressing growth from the physically exposed surfaces of the insulating layer 30. While the present disclosure is described using an example of a non-selective semiconductor epitaxy process, embodiments are expressly contemplated herein in which a selective semiconductor epitaxy process is used.

The thickness of the epitaxial base region 25 may be in a range from 40 nm to 300 nm, such as from 60 nm to 150 nm, although lesser and greater thicknesses can also be used. The average atomic concentration of the dopants of the first conductivity type in the epitaxial base region 25 can be in a range from $1.0\times10^{15}/cm^3$ to $3.0\times10^{17}/cm^3$, although lesser and greater average atomic concentration of dopants of the first conductivity type may be used in the epitaxial base region 25. The vertical profile of the dopants of the first conductivity type in the epitaxial base region 25 may be optimized for performance of the bipolar transistor.

A dielectric spacer may be formed on sidewalls of the polycrystalline base material layer 24L by conformal deposition of a dielectric material layer and a subsequent anisotropic etch process that etches horizontal portions of the dielectric material layer. A remaining tubular portion of the dielectric material layer comprises the dielectric spacer, which is herein referred to as an emitter pedestal spacer 28. The emitter pedestal spacer 28 may include a dielectric material such as silicon oxide and/or silicon nitride.

Figure 5E:
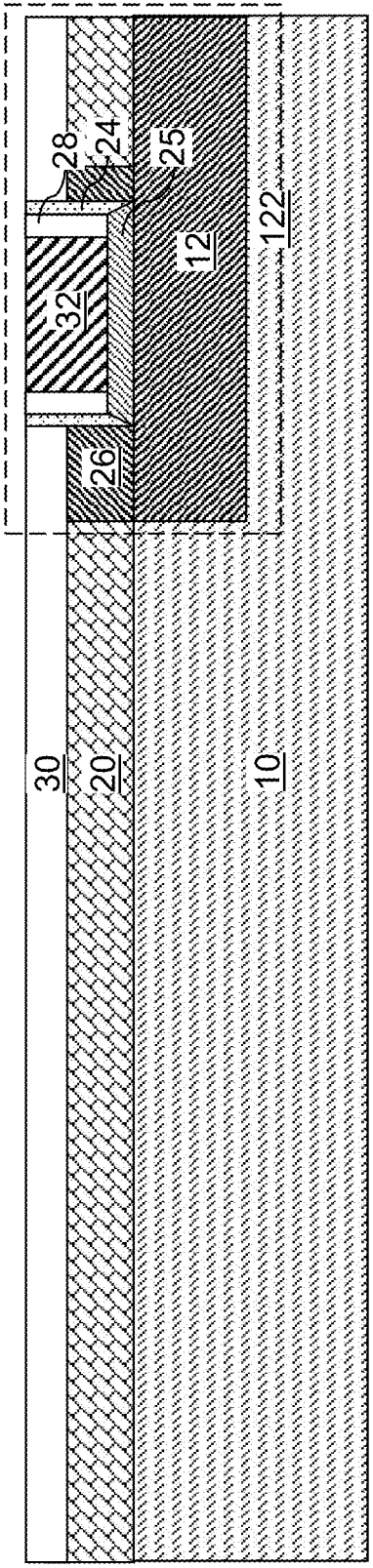
FIG. 5E is a vertical cross-sectional view of the exemplary structure after formation of an emitter region for the optional bipolar transistor according to an embodiment of the present disclosure.

Referring to FIG. 5E, a doped semiconductor material having a doping of the second conductivity type may be deposited in the remaining volume of the base cavity 21. A surface oxide having a thickness in a range from 0.3 nm to 1.0 nm may be formed at the interface between the epitaxial base region 25 and the deposited doped semiconductor material. In one embodiment, the deposited doped semiconductor material can include doped polysilicon including dopants of the second conductivity type at an atomic concentration in a range from $5.0\times10^{19}/cm^3$ to $2.0\times10^{21}/cm^3$, although lesser and greater atomic concentrations can also be used. Excess portions of the deposited doped semiconductor material and the polycrystalline base material layer 24L may be removed from above the horizontal plane including the top surface of the insulating layer 30 by a planarization process, which may use chemical mechanical planarization and/or a recess etch. A remaining portion of the doped semiconductor material located in the base cavity 21 and laterally surrounded by the emitter pedestal spacer 28 comprises an emitter region 32. A remaining tubular portion of the polycrystalline base material layer 24L comprises a polycrystalline base material region 24. The emitter pedestal spacer 28 prevents direct contact between the emitter region 32 and the polycrystalline base material region 24, thereby reducing a leakage current.

The combination of the collector region 12, the epitaxial base region 25, the polycrystalline base material region 24, the extrinsic base region 26, and the emitter region 32 comprises a bipolar transistor 122. The bipolar transistor 122 may include a collector region 12 formed within the handle substrate 10, an epitaxial base region 25 contacting a top surface of the collector region 12 and formed within the charge-trapping layer 20, and an emitter region 32 contacting a top surface of the epitaxial base region 25 and laterally surrounded by the charge-trapping layer 20. Formation of bipolar transistors 122 in the combination of the handle substrate 10, the charge-trapping layer 20, and the insulating layer 30 may be useful for some RFSOI devices, but may be omitted for some other RFSOI devices to reduce the production cost.

Figure 6:
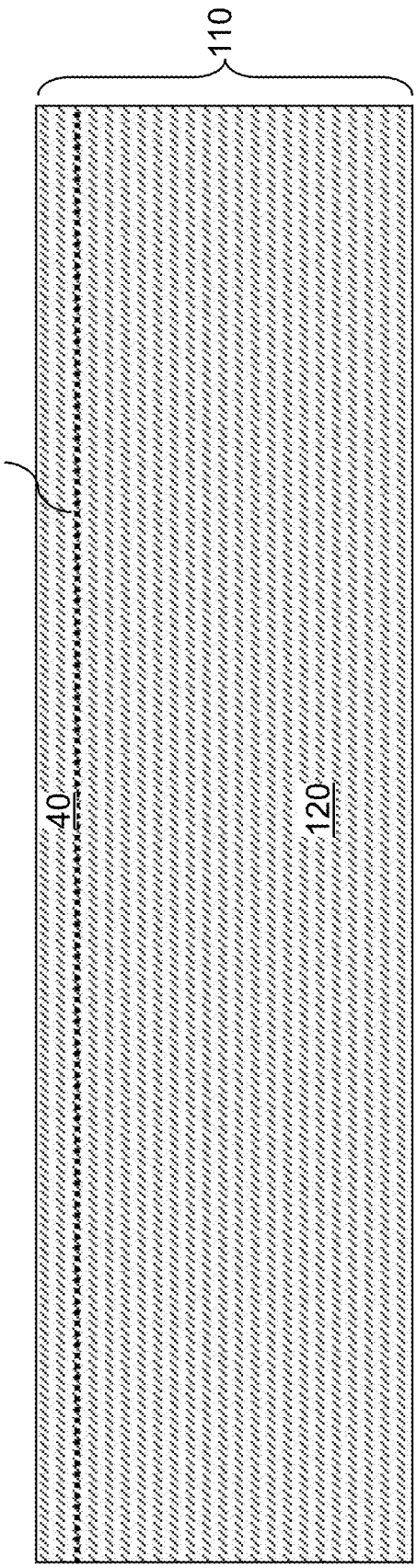
FIG. 6 is a vertical cross-sectional view of a source substrate including a semiconductor material layer and a hydrogen implantation layer according to an embodiment of the present disclosure.

Referring to FIG. 6, a source substrate 110 is illustrated, which includes a semiconductor material layer 40 to be transferred to the combination of the handle substrate 10, the charge-trapping layer 20, and the insulating layer 30. Specifically, the source substrate 110 may include a carrier substrate 120, the semiconductor material layer 40, and a hydrogen implantation layer 130 located at the boundary between the carrier substrate 120 and the semiconductor material layer 40. The source substrate 110 may be formed by providing a single crystalline semiconductor substrate such as a commercially available single crystalline silicon wafer, and by implanting hydrogen through a front surface of the single crystalline semiconductor substrate at a dose that is sufficient to form the hydrogen implantation layer 130. The lower portion (i.e., the bulk portion) of the single crystalline semiconductor substrate that underlies the hydrogen implantation layer 130 comprises the carrier substrate 120, and the upper portion (i.e., the surface portion) of the single crystalline semiconductor substrate that overlies the hydrogen implantation layer 130 comprises the semiconductor material layer 40, which can comprise, and/or can consist of, a single crystalline semiconductor material such as single crystalline silicon. The depth of the hydrogen implantation layer 130 can be in a range from 10 nm to 300 nm, although lesser and greater thicknesses can also be used.

Figure 7:
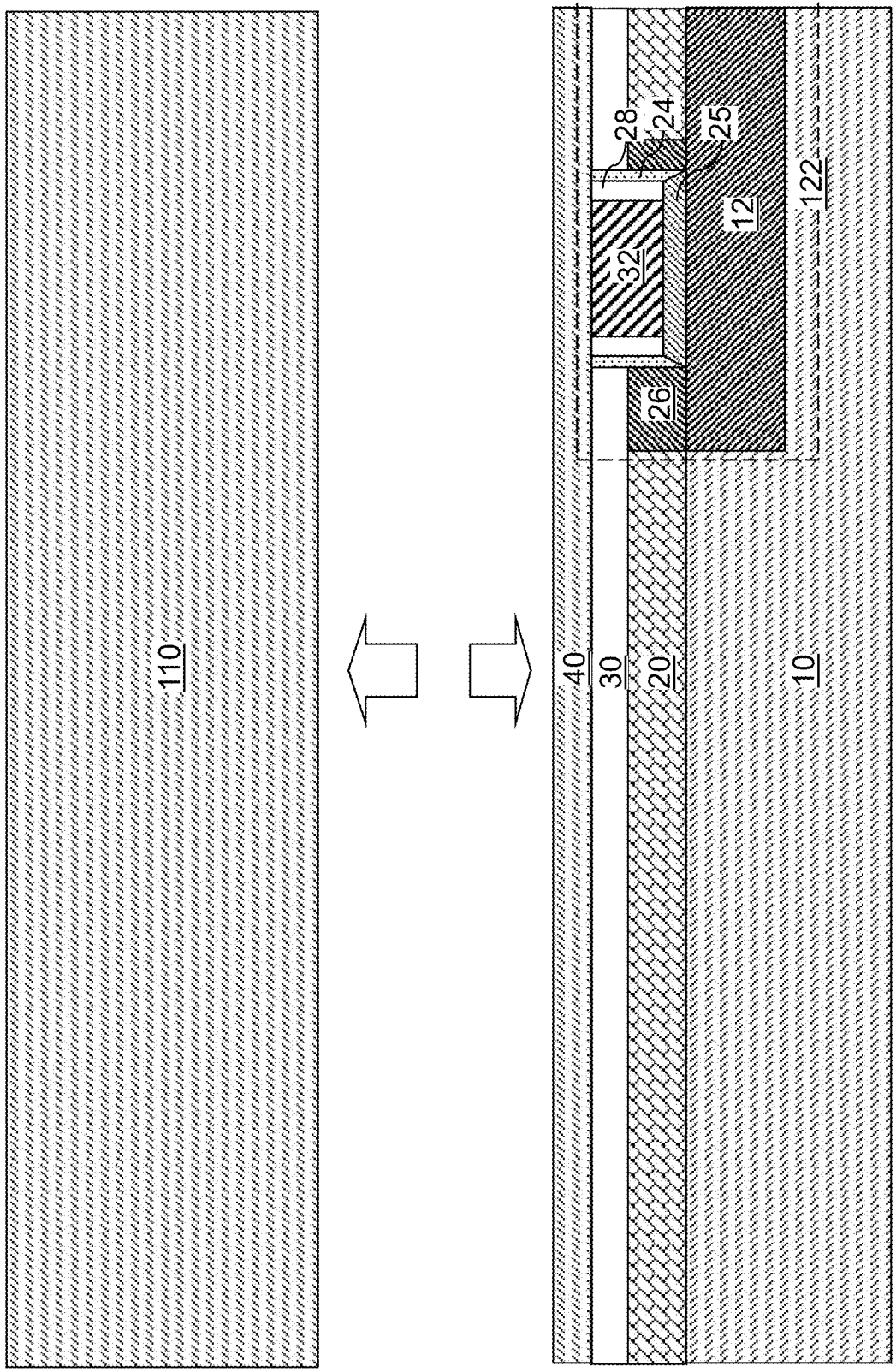
FIG. 7 is a vertical cross-sectional view of the exemplary structure after transferring the semiconductor material layer from the source substrate to the assembly of the handle substrate, the charge-trapping layer, and the insulating layer according to an embodiment of the present disclosure.

Referring to FIG. 7, the semiconductor material layer 40 may be bonded to the top surface of the insulating layer 30 by semiconductor-to-oxide bonding. For example, the source substrate 110 may be disposed to the top surface of the insulating layer 30 such that the semiconductor material layer 40 contacts the top surface of the insulating layer 30. A first anneal process may be performed at a first elevated temperature to induce semiconductor-to-oxide bonding between the semiconductor material of the semiconductor material layer 40 and the silicon oxide material of the insulating layer 30. The first elevated temperature may be in a range from 150 degrees Celsius to 400 degrees Celsius, such as from 250 degrees Celsius to 350 degrees Celsius. Optionally, pressure may be applied to press the assembly of the handle substrate 10, the charge-trapping layer 20, and the insulating layer 30 against the source substrate 110.

Subsequently, a second anneal process may be performed at a second elevated temperature to induce coalescence of hydrogen-filled cavities within the hydrogen implantation layer 130 into a continuous cavity. The second elevated temperature may be in a range from 400 degrees Celsius to 600 degrees Celsius. A process commonly known as a "Smart Cut process" may be used. The source substrate 110 may be split into two disjoined portions of the carrier substrate 120 and the semiconductor material layer 40. The carrier substrate 120 may be removed, and may be reused as another source substrate upon formation of another hydrogen implantation layer therein. The semiconductor material layer 40 is bonded to the insulating layer 30 to provide a semiconductor-on-insulator (SOI) substrate (10, 20, 30, 40). The semiconductor material layer 40 can comprise, and/or can consist of, single crystalline silicon, and can have a thickness in a range from 10 nm to 300 nm, although lesser or greater thicknesses may also be used. Generally, the thickness of the semiconductor material layer 40 can be selected to enable formation of suitable semiconductor devices thereupon. In one embodiment, the thickness of the semiconductor material layer 40 may be in a range from 30 nm to 100 nm, although lesser and greater thicknesses may also be used.

Figure 8:
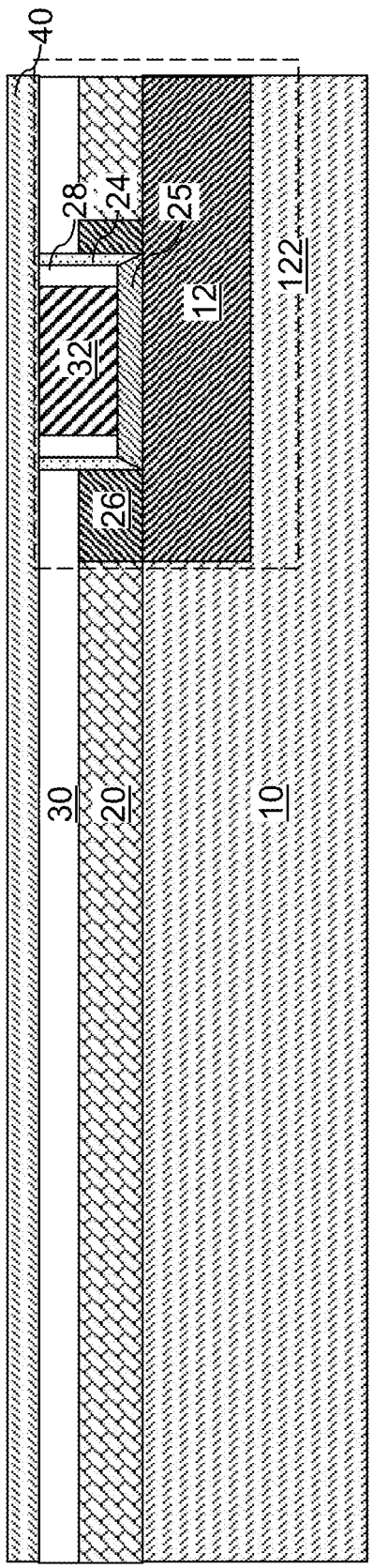
FIG. 8 is a vertical cross-sectional view of the exemplary structure after optionally thinning and/or planarizing the semiconductor material layer according to an embodiment of the present disclosure.

Referring to FIG. 8, the semiconductor material layer 40 of the SOI substrate (10, 20, 30, 40) can be optionally thinned, for example, by polishing. The root-mean-square (RMS) roughness of the top surface of the semiconductor material layer 40 can be reduced by the thinning process. The thickness of the semiconductor material layer 40 after the thinning process may be in a range from 50 nm to 500 nm, although lesser and greater thicknesses can also be used.

Figure 9:
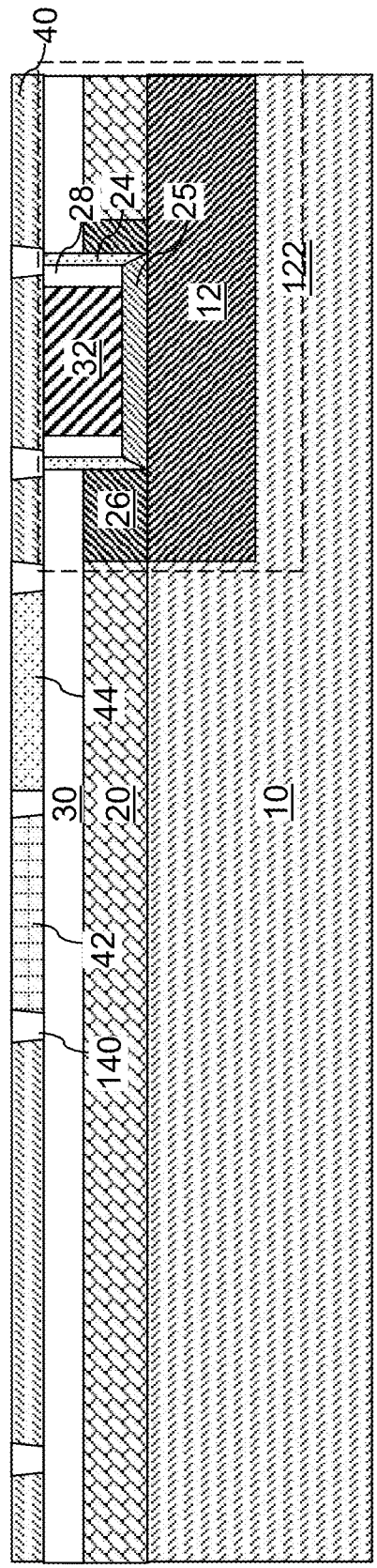
FIG. 9 is a vertical cross-sectional view of the exemplary structure after formation of shallow trench isolation structures according to an embodiment of the present disclosure.

Referring to FIG. 9, various shallow trench isolation structures 140 may be formed in the semiconductor material layer 40. For example, shallow trenches vertically extending to the top surface of the insulating layer 30 may be formed through the semiconductor material layer 40 at boundaries of various semiconductor device regions. For example, the shallow trenches may be formed to laterally encircle each combination of a body region, a source region, and a drain region of field effect transistors to be subsequently formed. Further, the shallow trenches may be formed at each periphery of a bipolar transistor and passive devices to be subsequently formed. A dielectric material such as silicon oxide may be deposited in the shallow trenches, and excess portions of the dielectric material may be removed from above the horizontal plane including the top surface of the semiconductor material layer 40. The remaining portions of the dielectric material comprise the shallow trench isolation structures 140. The shallow trench isolation structures 140 may laterally enclose discrete patterned portions of the semiconductor material layer 40, and may contact the top surface of the insulating layer 30. P-type dopants and/or n-type dopants can be implanted into a respective discrete patterned portion of the semiconductor material layer 40 to form at least one p-well 42 and/or at least one n-well 44 in a complementary metal-oxide-semiconductor (CMOS) device region.

Figure 10:
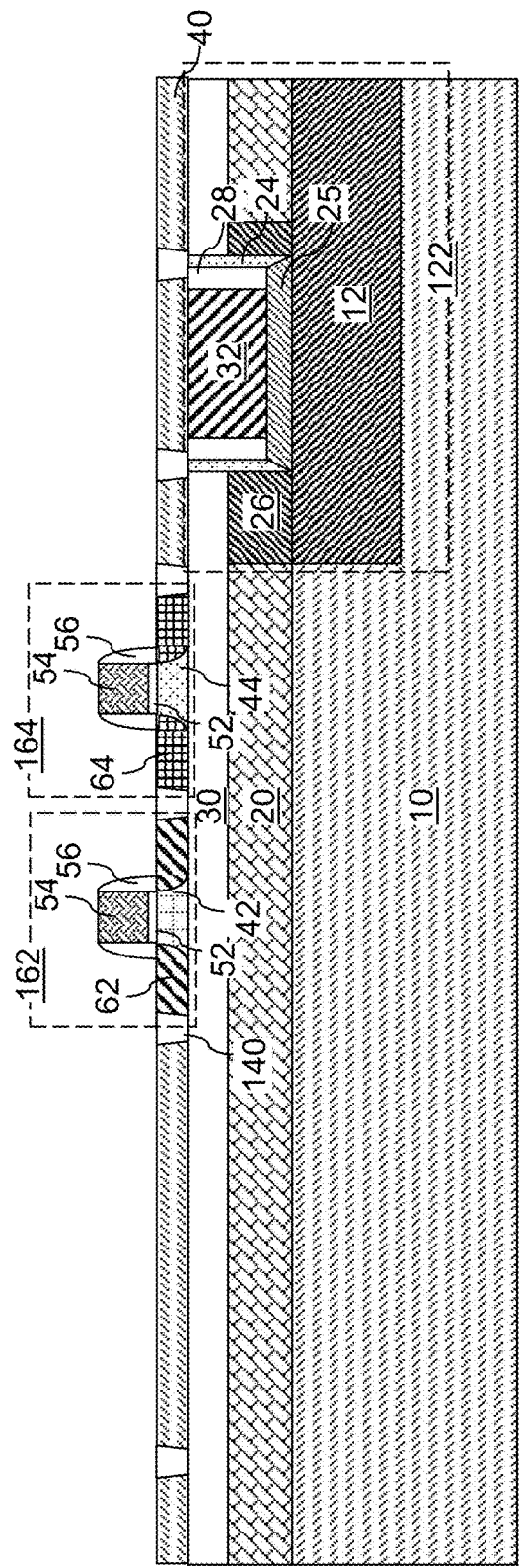
FIG. 10 is a vertical cross-sectional view of the exemplary structure after formation of complementary metal-oxide-semiconductor (CMOS) transistors according to an embodiment of the present disclosure.

Referring to FIG. 10, a gate dielectric layer may be formed, for example, by thermal oxidation of a surface portion of the semiconductor material layer 40 (including the surface portions of the p-wells 42 and the n-wells 44). A gate electrode material layer (which can include polysilicon and/or at least one metallic material) may be deposited over the gate dielectric layer. In embodiments in which the gate electrode material layer includes a polysilicon, material regions of the polysilicon material to be used as gate electrodes can be suitably implanted with p-type dopants or n-type dopants. The gate electrode material layer and the gate dielectric layer may be subsequently patterned, for example, by applying and patterning a photoresist layer over the gate electrode material layer into a pattern of gate electrodes, and by anisotropically etching unmasked portions of the gate electrode material layer and the gate dielectric layer. Each patterned portion of the gate dielectric layer comprises a gate dielectric 52, and each patterned portion of the gate electrode material layer comprises a gate electrode 54.

Gate spacers 56 may be formed on the sidewalls of each gate structure (52, 54) including a gate dielectric 52 and a gate electrode 54. P-type dopants may be implanted prior to, and/or after, formation of the gate spacers 56 into portions of the n-wells 44 that are not masked by the gate structures (52, 54) to form p-doped active regions 64, which include p-doped source regions and p-doped drain regions. N-type dopants may be implanted prior to, and/or after, formation of the gate spacers 56 into portions of the p-wells 42 that are not masked by the gate structures (52, 54) to form n-doped active regions 62, which include n-doped source regions and n-doped drain regions. NPN transistors 162 and PNP transistors 164 can be formed in the CMOS device region.

Measurement of wafer distortion on samples including the charge-trapping layer 20 containing nitrogen-doped polysilicon of embodiments of the present disclosure show significant decrease in the wafer warpage by about 80% as compared to comparative exemplary samples uses a nitrogen-free polysilicon as a charge-trapping layer. The reduction in the wafer warpage may be attributed to suppression of the grain growth in the charge-trapping layer 20, and resulting reduction in the stress generated by the charge-trapping layer 20 and applied to the semiconductor material layer 40. Further, testing on the field effect transistors using the methods of embodiments of the present disclosure show much tighter threshold voltage distribution for the various field effect transistors, which is attributed to enhanced overlay registration for the lithographic pattern for patterning the gate structures of the field effect transistors and preexisting alignment patterns.

Figure 11:
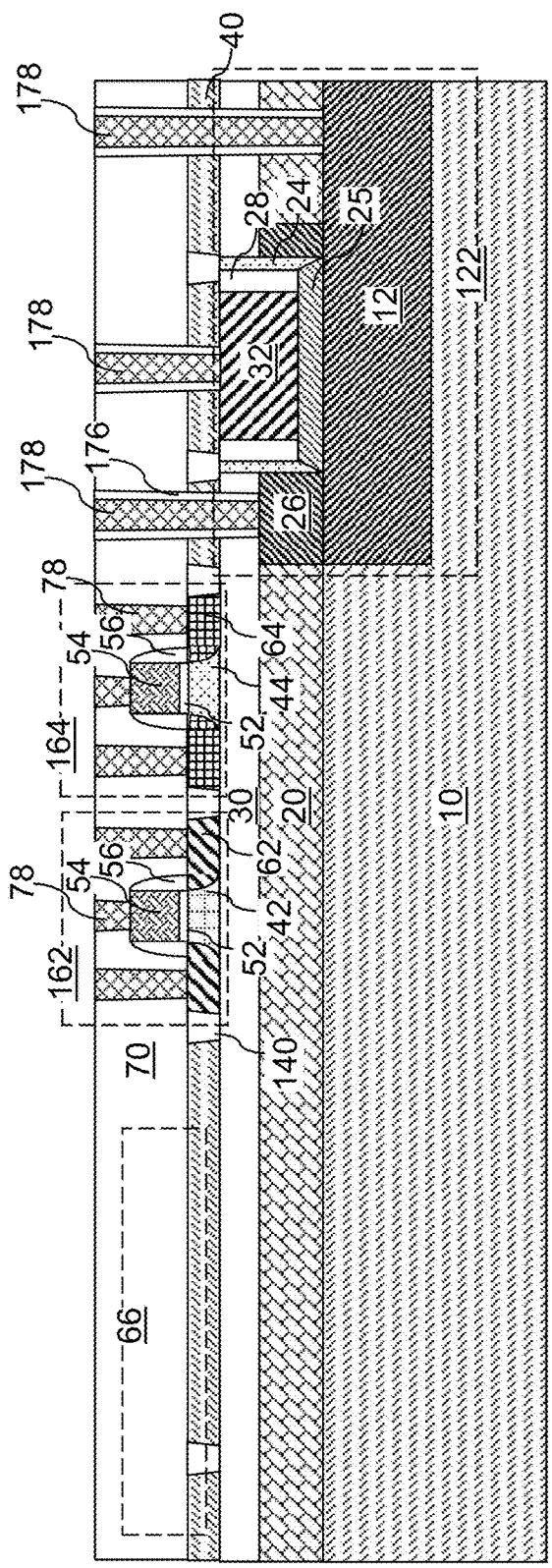
FIG. 11 is a vertical cross-sectional view of the exemplary structure after formation of passive devices, a contact-level dielectric layer, and contact via structures according to an embodiment of the present disclosure.

Referring to FIG. 11, a contact-level dielectric layer 70 may be formed over the field effect transistors (162, 164), and may be planarized to provide a horizontal top surface. Contact via structures (78, 178) may be formed to various nodes of the optional bipolar transistor(s) 122 and the field effect transistors (162, 164). For example, the contact via structures (78, 178) may include CMOS device contact via structures 78 that contact various nodes of the field effect transistors (162, 164) and bipolar device contact via structures 178 that contact various nodes of the optional bipolar transistor(s) 122. Insulating liners 176 may be used to electrically isolate each bipolar device contact via structure 178 from surrounding conductive or semiconducting material portions, which may include the semiconductor material layer 40 and the charge-trapping layer 20. Passive devices 66 such as resistors, diodes, and thyristors may be formed in, on, or above, the semiconductor material layer.

Figure 12:
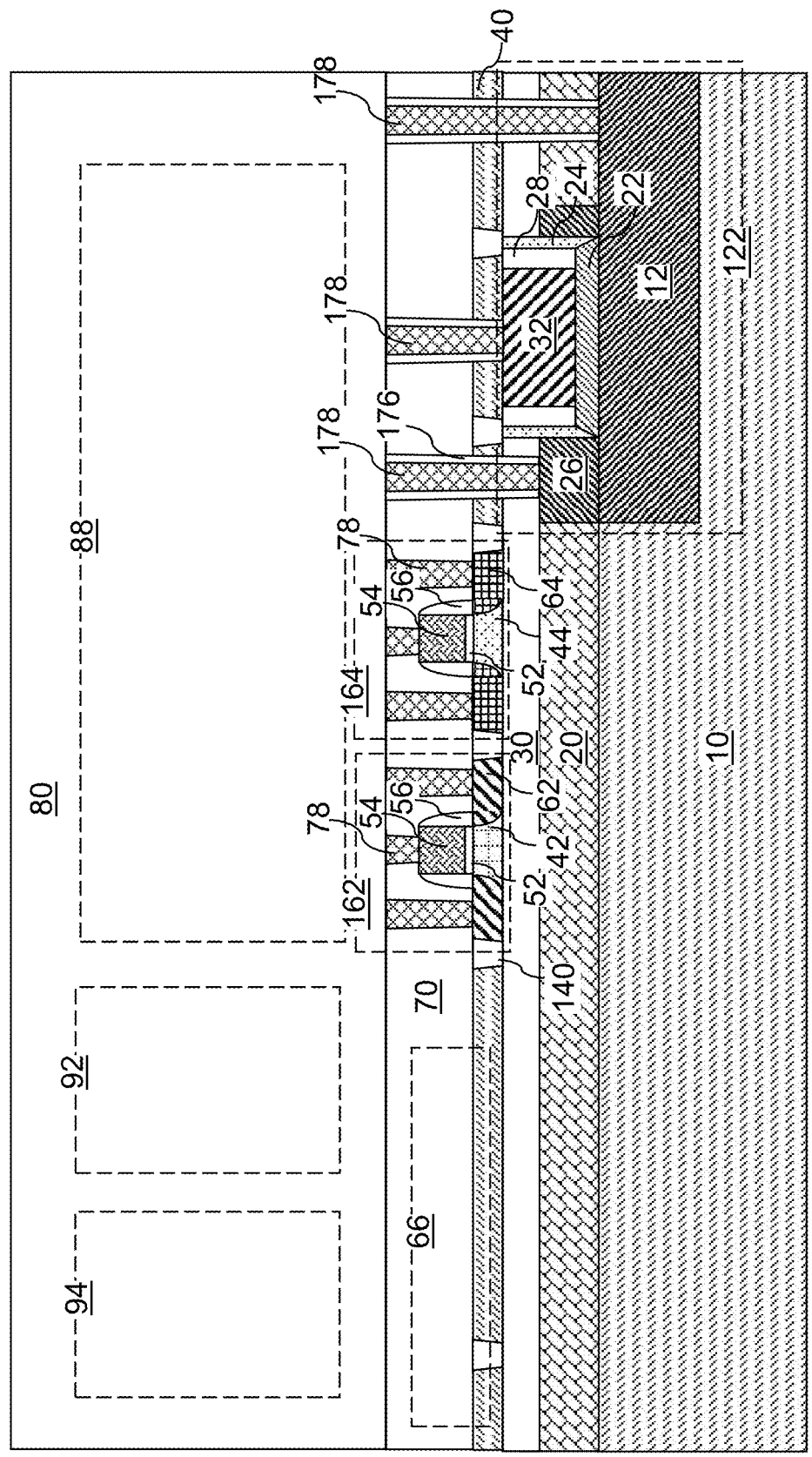
FIG. 12 is a vertical cross-sectional view of the exemplary structure after formation of interconnect-level dielectric layers, metal interconnect structures, and additional passive devices according to an embodiment of the present disclosure.

Referring to FIG. 12, interconnect-level dielectric layers 80 may be formed above the contact-level dielectric layer 70. Metal interconnect structures 88 may be formed within the interconnect-level dielectric layers 80. The interconnect-level dielectric layer may include, from bottom to top, a first line-level dielectric layer, a first via-level dielectric layer, a second line-level dielectric layer, a second via-level dielectric layer, a third line-level dielectric layer, a third via-level dielectric layer, and so on. The metal interconnect structures 88 may include first metal lines formed within the first line-level dielectric layer, first via structures formed within the first via-level dielectric layer, second metal lines formed within the second line-level dielectric layer, second via structures formed within the second via-level dielectric layer, third metal lines formed within the third line-level dielectric layer, third via structures formed within the third via-level dielectric layer, and so on. Bonding structures such as metal pads may be formed at the topmost level of the interconnect-level dielectric layers 80.

Additional passive devices (92, 94) may be formed within the interconnect-level dielectric layers 80. The additional passive devices (92, 94) can include, for example, capacitors, varactors, inductors, and antennas. In particular, inductors and capacitors can be provided to enable a resonant circuit to operate in conjunction with the antennas.

Generally, at least one semiconductor device may be formed on, and/or in, the semiconductor material layer 40. The at least one semiconductor device may comprise field effect transistors configured to operate in a frequency range from 1 GHz to 100 GHz. Further, the at least one semiconductor device may comprise a radio-frequency circuit including at least one capacitor and at least one inductor and configured to operate in a frequency range from 1 GHz to 100 GHz. The atomic concentration of nitrogen atoms in the charge-trapping layer 20 may be substantially uniform. For example, the atomic concentration of nitrogen atoms in the charge-trapping layer 20 may be within a range from 70% of the average atomic concentration of the nitrogen atoms to 130% of the average atomic concentration of the nitrogen atoms in the charge-trapping layer 20 in a final device. In one embodiment, the atomic concentration of nitrogen atoms in the charge-trapping layer 20 may be within a range from 85% of the average atomic concentration of the nitrogen atoms to 115% of the average atomic concentration of the nitrogen atoms in the charge-trapping layer 20 in a final device.

Figure 13:
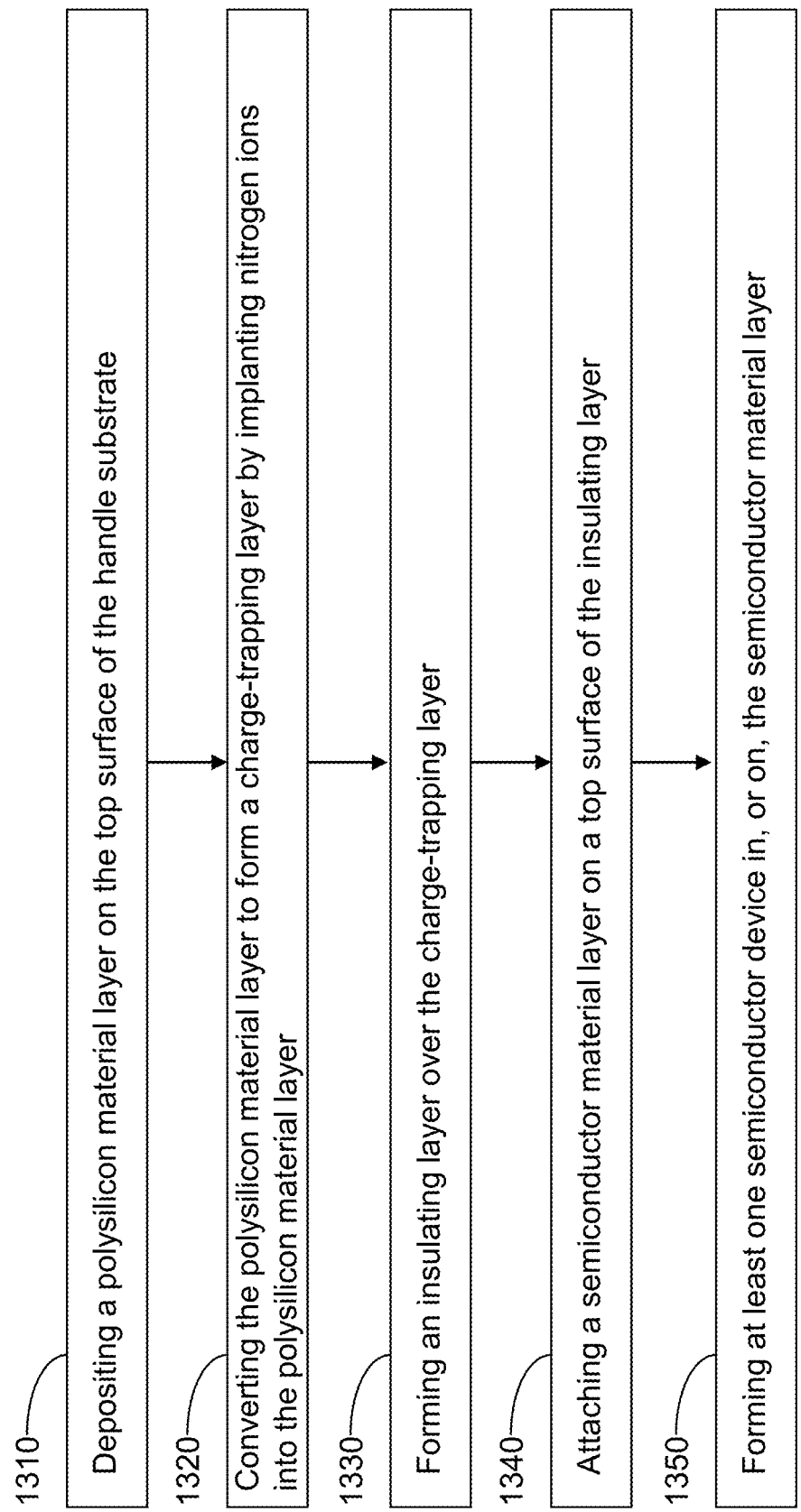
FIG. 13 is a process flowchart illustrating steps for forming an RFSOI semiconductor structure according to an embodiment of the present disclosure.

Referring to FIG. 13, a flowchart illustrates processing steps of embodiments of the present disclosure that may be used to form an RFSOI semiconductor structure according to an embodiment of the present disclosure. Referring to step 1310, a polysilicon material layer 22 can be deposited on a top surface of a handle substrate 10. Referring to step 1320, nitrogen ions can be implanted into the polysilicon material layer 22 to form a charge-trapping layer 20, which comprises nitrogen-doped polysilicon. Referring to step 1330, an insulating layer 30 can be formed over the charge-trapping layer 20. Referring to step 1340, a semiconductor material layer 40 can be attached on a top surface of the insulating layer 30. Referring to step 1350, at least one semiconductor device can be formed in, or on, the semiconductor material layer 40.

Referring to all drawings and according to various embodiments of the present disclosure, a semiconductor-on-insulator (SOI) substrate (10, 20, 30, 40) is provided, which comprises a handle substrate 10, a charge-trapping layer 20 (which is a nitrogen-doped polysilicon layer) located over the handle substrate 10 and comprising nitrogen-doped polysilicon, an insulating layer 30 located over the charge-trapping layer 20, and a semiconductor material layer 40 located over the insulating layer 30.

According to another embodiment of the present disclosure, a semiconductor structure is provided, which comprises a semiconductor-on-insulator (SOI) substrate (10, 20, 30, 40) comprising a stack that contains, from bottom to top, a handle substrate 10, a charge-trapping layer 20 (which is a nitrogen-doped polysilicon layer) comprising nitrogen-doped polysilicon, an insulating layer 30, and a semiconductor material layer 40, and at least one semiconductor device located within, or on, the semiconductor material layer 40.

According to another embodiment of the present disclosure, a method for forming a semiconductor structure is provided. The embodiment method may include the steps of: depositing a polysilicon material layer over a top surface of a handle substrate 10. The method may also include the steps of converting the polysilicon material layer into a nitrogen-doped polysilicon charge-trapping layer 20; forming an insulating layer 30 over the nitrogen-doped polysilicon charge-trapping layer 20; attaching a semiconductor material layer 40 on a top surface of the insulating layer 30; and forming at least one semiconductor device in, or on, the semiconductor material layer 40.

According to another embodiment of the present disclosure, a method for forming a semiconductor-on-insulator (SOI) substrate is provided. The embodiment method may include the steps of: forming a polysilicon layer on a handle substrate 10; implanting nitrogen atoms into the polysilicon layer in a plurality of implantation processes to form a nitrogen-doped polysilicon layer having a substantially uniform concentration of the nitrogen atoms; forming an insulating layer 30 over the nitrogen-doped polysilicon charge-trapping layer 20; and attaching a semiconductor material layer 40 to the insulating layer 30.

According to another embodiment of the present disclosure, a method for forming a semiconductor-on-insulator (SOI) substrate is provided. The embodiment method may include the steps of: forming a polysilicon layer on a handle substrate 10; implanting nitrogen atoms into the polysilicon layer in a plurality of implantation processes to form a nitrogen-doped polysilicon layer having a substantially uniform concentration of the nitrogen atoms; annealing the nitrogen-doped polysilicon layer at a temperature in a range from 600° C. to 1,050° C. for a duration in a range from 10 seconds to 120 minutes; after the annealing of the nitrogen-doped polysilicon layer, oxidizing a surface of the nitrogen-doped polysilicon layer to form a thermal silicon oxide layer on the nitrogen-doped polysilicon layer; and attaching a semiconductor layer 40 to the thermal silicon oxide layer, comprising: bonding a source substrate 110 comprising the semiconductor layer to the thermal silicon oxide layer by semiconductor-to-oxide bonding; and separating the semiconductor layer from a remaining portion of the source substrate.

The various embodiments of the present disclosure pins free charge carriers in the handle substrate 10 at the grain boundaries of the charge-trapping layer 20. Further, electrical charges in the charge-trapping layer 20 may be trapped in localized states at the grain boundaries. Thus, free electrical charges that can respond to a high frequency electrical field may be removed from underneath the insulating layer 30, and the effective resistivity of the combination of the handle substrate 10 and the charge-trapping layer 20 can be in a range from $3.0 \times 10^2$ Ω-cm to $3.0 \times 10^4$ Ω-cm not only for DC device characteristics, but also for operational frequencies above 1 GHz such as within a range from 1 GHz to 100 GHz. Eddy currents in the handle substrate 10 and the charge-trapping layer 20 may be significantly decreased through reduction of the free charge carriers in the handle substrate 10 and the charge-trapping layer 20. Cross talks and non-linear distortions of signals in the semiconductor devices may be minimized, and signal fidelity of in the semiconductor circuits on the semiconductor material layer 40 may be enhanced especially for high frequency operations. In addition, by implanting the charge-trapping layer 20 with nitrogen ions, the grain growth in the charge-trapping layer 20 may be suppressed during subsequent anneal processes. Suppression of grain growth during subsequent anneal processes reduces structural distortion such as warping (warpage) of the SOI substrate, and allows lithographic patterning of various device features in subsequent processing steps within reduced overlay deviations with respect to previously patterned structures. Thus, the SOI may be thermally stable and reduces structural distortion such as warping (warpage) of the SOI substrate that may occur during subsequent processing steps that subject the substrate to higher thermal temperatures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
    depositing a polysilicon material layer on a top surface of a handle substrate;
    converting the polysilicon material layer into a nitrogen-doped polysilicon layer;
    thermally oxidizing a top portion of the nitrogen-doped polysilicon layer into a thermal oxide layer;
    forming a semiconductor device in a remaining portion of the nitrogen-doped polysilicon layer and the thermal oxide layer; and
    attaching a semiconductor material layer on a top surface of the thermal oxide layer and a top surface of the semiconductor device.

2. The method of claim 1, wherein converting the polysilicon material layer into the nitrogen-doped polysilicon layer comprises implanting nitrogen ions into the polysilicon material layer.

3. The method of claim 2, wherein a total dose of nitrogen ions implanted into the polysilicon material layer is selected such that the nitrogen-doped polysilicon layer comprises nitrogen atoms at an average atomic concentration in a range of $1.0 \times 10^{16}/cm^3$ to $1.0 \times 10^{20}/cm^3$.

4. The method of claim 2, wherein the nitrogen ions are implanted into the polysilicon material layer using a plurality of nitrogen implantation processes having different average ion implantation depths.

5. The method of claim 1, wherein the thermally oxidizing of the top portion of the nitrogen-doped polysilicon layer comprises annealing the remaining portion of the nitrogen-doped polysilicon layer at an elevated temperature in a range from 900 degrees Celsius to 1,100 degrees Celsius for a duration in a range from 10 seconds to 120 minutes.

6. The method of claim 1, wherein the semiconductor device comprises a radio-frequency circuit configured to operate at a frequency in a range from 1 GHz to 100 GHz.

7. A method of forming a semiconductor structure, comprising:
    forming a nitrogen-doped polysilicon layer;
    annealing the nitrogen-doped polysilicon layer such that nitrogen in the nitrogen-doped polysilicon layer suppresses an increase in grain size of the nitrogen-doped polysilicon layer;
    thermally oxidizing a top portion of the nitrogen-doped polysilicon layer to form a thermal oxide layer;
    forming a semiconductor device in a remaining portion of the nitrogen-doped polysilicon layer and the thermal oxide layer; and
    attaching a semiconductor layer to a top surface of the thermal oxide layer and a top surface of the semiconductor device.

8. The method of claim 7, wherein the forming of the nitrogen-doped polysilicon layer comprises forming the nitrogen-doped polysilicon layer to have a substantially uniform concentration of nitrogen atoms.

9. The method of claim 7, wherein the forming of the nitrogen-doped polysilicon layer comprises implanting nitrogen into a polysilicon layer in a plurality of implantation processes to form the nitrogen-doped polysilicon layer.

10. The method of claim 9, wherein the implanting of the nitrogen comprises implanting the nitrogen into the polysilicon layer such that a variation of an atomic concentration of nitrogen atoms within the nitrogen-doped polysilicon layer as a function of vertical distance from the handle substrate is within 30% of an average atomic concentration of the nitrogen atoms in the nitrogen-doped polysilicon layer.

11. The method of claim 9, wherein the implanting of the nitrogen comprises implanting the nitrogen in the plurality of implantation processes at a plurality of target depths, respectively.

12. The method of claim 9, wherein the implanting of the nitrogen comprises implanting the nitrogen at a plurality of implantation energies in a range from 0.5 MeV to 50 MeV.

13. The method of claim 9, wherein the implanting of the nitrogen comprises implanting a total dose of the nitrogen such that the nitrogen-doped polysilicon layer comprises an average atomic concentration of nitrogen atoms in a range from $1.0 \times 10^{16}/cm^3$ to $1.0 \times 10^{20}/cm^3$.

14. The method of claim 7, wherein the annealing of the nitrogen-doped polysilicon layer comprises annealing the nitrogen-doped polysilicon layer at a temperature in a range from 600° C. to 1,050° C.

15. The method of claim 7, wherein the annealing of the nitrogen-doped polysilicon layer comprises annealing the nitrogen-doped polysilicon layer such that an increase in grain size of the nitrogen-doped polysilicon layer caused by the annealing of the nitrogen-doped polysilicon layer is less than 20%.

16. The method of claim 7, wherein the annealing of the nitrogen-doped polysilicon layer comprises annealing the nitrogen-doped polysilicon layer for a duration in a range from 10 seconds to 120 minutes.

17. The method of claim 7, wherein the thermally oxidizing of the top portion of the nitrogen-doped polysilicon layer comprises thermally oxidizing the top portion of the nitrogen-doped polysilicon layer at a temperature in a range from 800° C. to 1,100° C.

18. The method of claim 7, wherein the thermally oxidizing of the top portion of the nitrogen-doped polysilicon layer comprises forming the thermal oxide layer on a remaining portion of the nitrogen-doped polysilicon.

19. The method of claim 7, further comprising:
    before the attaching of the semiconductor layer, thinning the thermal oxide layer to have a thickness in a range from 50 nm to 500 nm.

20. A method of forming a semiconductor structure, comprising:
    annealing a nitrogen-doped polysilicon layer such that nitrogen in the nitrogen-doped polysilicon layer suppresses an increase in grain size of the nitrogen-doped polysilicon layer;
    thermally oxidizing a top portion of the nitrogen-doped polysilicon layer to form a thermal oxide layer;
    forming a semiconductor device in a remaining portion of the nitrogen-doped polysilicon layer and the thermal oxide layer; and
    attaching a semiconductor layer to a top surface of the thermal oxide layer and a top surface of the semiconductor device.

* * * * *